(12) United States Patent  
Brunschwiler et al.

(10) Patent No.: US 8,413,712 B2
(45) Date of Patent: Apr. 9, 2013

(54) COOLING DEVICE

(75) Inventors: Thomas J. Brunschwiler, Thalwil (CH);
Urs Kloter, Dietikon (CH); Ryan Joesph Linderman, Zurich (CH);
Bruno Michel, Adliswil (CH); Hugo E. Rothuizen, Adliswil (CH)

(73) Assignee: International Business Machines Corporation, Armonk, NY (US)

( * ) Notice: Subject to any disclaimer, the term of this patent is extended or adjusted under 35 U.S.C. 154(b) by 1315 days.

(21) Appl. No.: 11/598,497

(22) Filed: Nov. 13, 2006

(65) Prior Publication Data

US 2007/0119565 A1 May 31, 2007

(30) Foreign Application Priority Data

Nov. 14, 2005 (EP) .................... 05405630

(51) Int. Cl.
*F28F 7/02* (2006.01)
(52) U.S. Cl. .................. 165/80.2; 165/80.5; 165/908
(58) Field of Classification Search .......... 165/80.2, 165/80.4, 80.5, 908; 361/696, 699
See application file for complete search history.

(56) References Cited

U.S. PATENT DOCUMENTS

| 3,909,118 | A | * | 9/1975 | Schmidt .................... 165/908 |
| 4,302,793 | A |  | 11/1981 | Rohner |
| 4,740,866 | A |  | 4/1988 | Kajiwara et al. |
| 4,758,926 | A |  | 7/1988 | Herrell et al. |
| 5,265,670 | A | * | 11/1993 | Zingher .................... 165/80.4 |
| 5,269,372 | A | * | 12/1993 | Chu et al. ................ 165/80.4 |
| 5,270,572 | A | * | 12/1993 | Nakajima et al. ........ 165/80.4 |
| 5,309,319 | A | * | 5/1994 | Messina ................... 165/80.4 |
| 5,388,635 | A | * | 2/1995 | Gruber et al. ............. 165/80.4 |
| 5,731,954 | A |  | 3/1998 | Cheon |
| 6,234,240 | B1 |  | 5/2001 | Cheon |
| 6,459,581 | B1 |  | 10/2002 | Newton et al. |
| 6,606,251 | B1 |  | 8/2003 | Kenny, Jr. et al. |
| 6,650,542 | B1 | * | 11/2003 | Chrysler et al. .......... 165/80.4 |
| 6,678,168 | B2 |  | 1/2004 | Kenny, Jr. et at. |
| 6,688,110 | B2 | * | 2/2004 | Dailey et al. ............ 165/908 |
| 2006/0266497 | A1 | * | 11/2006 | Berger et al. ............ 165/80.4 |

* cited by examiner

*Primary Examiner* — Teresa Walberg
(74) *Attorney, Agent, or Firm* — William Stock; Anne Vachon Dougherty

(57) ABSTRACT

A cooling device has a large number of closely spaced impinging jets, adjacent an impingement gap, with parallel return paths for supplying coolant flow for the impinging jets with the least possible pressure drop using an interdigitated, branched hierarchical manifold. Surface enhancement features spanning the impingement gap form U-shaped microchannels between single impinging jets and single outlets.

19 Claims, 23 Drawing Sheets

COOLING DEVICE

FIELD OF THE INVENTION

This invention relates to a cooling device and particularly relates to impingement coolers in contact with microprocessor chips.

TECHNICAL BACKGROUND

In the field of microprocessor chip packages, an effective transfer of thermal energy from a microprocessor chip to a heat sink is important for thermal management of the microprocessor chip.

A known type of active cooling device is an impingement cooler in which coolant flows through channels in the impingement cooler and is then fed through a jet and impinges on the back side of the microprocessor chip. An external pump is used to circulate the coolant between the back side of the microprocessor chip, where heat is absorbed, and a radiator. Heat is subsequently dissipated from the radiator to ambient using, for example, a fan and an air heat exchanger.

A further type of known cooling device for cooling microprocessor chips is a microchannel cooler, as described in "A Practical Implementation of Silicon Microchannel Coolers for High Power Chips" by E. G. Colgan et al., 21$^{st}$ IEEE SEMI-THERM Symposium, 1-7 (2005). A manifold part and a channel part are bonded together to form multiple heat exchanger zones and cooler fins. A coolant flows through parallel channels in the device and the flow length between a coolant inlet and a coolant outlet is approximately 3 mm.

A third type of known cooling device for laminar convective heat transfer from a solid to a liquid is tree-like microchannel net. This structure efficiently removes heat like a classical microchannel cooler but does not require an additional manifold (Senn and Poulikakos, J. Power Sources, 130, 178-191 (2004).

Generally, the transfer of thermal energy is proportional to the area of a heat exchange surface of the microprocessor chip and also increases in near proportion with the velocity of a coolant moving along the heat exchange surface. A further means of increasing the amount of heat exchanged is to employ geometries which impinge the coolant flow against the exchange surface. This has the effect of decreasing the thickness of the thermal boundary layer which exists at the surface, thereby enhancing transport of heat from the hot solid to the bulk of the coolant flow.

An impingement cooler having a single jet may provide heat transfer for a localized area covered by the impinging jet flow field. Heat transfer performance may be relatively improved by reduction of the single jet diameter. However, this introduces the problem of the impinging jet flow field being reduced. To overcome this problem it is known to provide a jet impingement array.

A jet impingement array generally comprises a two-dimensional grid pattern of multiple impinging jets set in a manifold. A coolant fluid ejected from each impinging jet in the array, impinges the back side of the microprocessor chip, and then exits the space between the jet impingement array and the microprocessor chip, known as the impingement gap, through one or an array of outlets. Problematically, due to deflection of peripheral impinging jets, the drainage flow may accumulate at the edge of the impingement gap, which may reduce heat transfer performance. Further, collision of jet flow from neighboring impinging jets can result in mutual cancellation of flow speed. These localized regions of low or no flow are known as stagnation points. Also, where jet flow directly below an impinging jet does not flow away, a stagnation point occurs.

Such an impinging jet generally forms an inhomogeneous flow field. From the stagnation point at the centre, the flow field speed increases as radial distance from the stagnation point increases, until a maximum speed is reached at a radial distance of approximately 2-3 times the diameter of the impinging jet. As the radial distance from the stagnation point increases further, the flow field speed decreases with the second power of the radial distance from the impinging jet.

A coefficient known as the convective heat transfer coefficient, h, is used for characterizing convective heat transfer rates into the fluid phase. This coefficient is measured in units of W/cm$^2$-K, i.e. Watts per centimeter-squared Kelvin. In a situation where a fluid interfaces with a solid body, a thermal boundary layer of fluid may form. Then, h is equal to the local heat flux at the solid-fluid interface divided by the difference in temperature between the fluid bulk, or temperature of the fluid beyond the thermal boundary layer, and the surface temperature of the solid. In impingement jets or microchannels, both the value of h and of the bulk fluid temperature depend strongly on location, so that for a meaningful comparison of thermal performance between geometries one must define an effective heat transfer coefficient heff based on averaged quantities.

$$h_{eff} = \frac{q''}{T_{fsi} - T_{inlet}}$$

where q'' is a heat flux area-averaged over the fluid-solid interface, Tfsi is an effective temperature at the fluid-solid interface which must be derived on the basis of one or several temperatures measured at locations on the solid being cooled (e.g. on the junction side of a microprocessor chip), and Tinlet is the mass flow averaged temperature of the coolant when it enters the heat exchanger.

An average convective heat transfer coefficient of jet impingement cooling, where the fluid is water and an array of impingement jets have round nozzles, has been estimated using Martin's correlation (Martin, H., "Heat and Mass Transfer Between Impinging Gas Jets and Solid Surfaces", *Advances in Heat Transfer*, Academic Press, vol. 13, pp 1-60, 1977). Martin's correlation provides a relationship between an expected thermal performance of an array of impingement jets having round nozzles as a function of all key geometric parameters and fluid flow conditions, in a standard dimensionless form, and has been tested against a large set of experimental data. Martin's correlation provides information allowing an optimization of the geometric parameters of an impingement cooler for a given jet nozzle diameter.

It can be calculated, using Martin's correlation, that the cooling performance of a jet impingement cooler increases with decreasing jet pitch and jet nozzle size. Scaling a jet impingement array to smaller dimensions enlarges the proportion of a pressure drop from the manifold as impinging jet nozzle diameter is reduced, because the jet pitch is also reduced. A practical minimum jet nozzle diameter can be approximately 80 microns, μm, where the impingement gap G would be approximately 320 μm and the jet pitch P approximately 300 μm, which would correspond to values of heff between 10 and 15 W/cm$^2$-K, depending on the jet flow velocity. Thus, as jet flow velocity increases, the required fluid flow and pressure drop also increase.

Jet impingement arrays as discussed so far are problematic in that they generate a flow field which is inhomogeneous not only locally on the scale of the distance between individual jets but also globally over the area of the larger surface to be cooled, because jets positioned radially outwards from the array center are deflected by the radial flow of coolant coming from the more centrally positioned jets. Thus, the rate of cooling may be substantially less at the periphery of the chip than at the center. Similarly, microchannel coolers generally present poor long-range cooling uniformity because the fluid warms up along the relatively long channels.

Drainage of a jet array in a closed system is done by one exit port—a concept which scales poorly due to the accumulating crossflow. In Saad et al., 1992 the adverse effect of crossflow in a slot nozzle array is alleviated by the use of distributed return by exit ports interleaved with the inlet port array. This reduces the impingement configuration to a collection of individual cells which form a self-contained unit and can be used in arbitrarily large arrays i.e. this system scales with the size of the surface to be cooled. One of the principal issues of this approach is to provide feed and return flow to the individual cells in a way that is compatible with one sided access to the inlet and outlet arrays and retain the property of low pressure drop.

From scientific literature it is known that from a thermal performance point of view it is desirable to scale down the physical dimensions of an impingement cell. Thus, in order to achieve a desirable thermal transfer performance it is preferable for jet nozzles to be relatively small, in the range of 20-100 μm.

It is a further problem associated with jet impingement coolers that heat transfer is only possible through the impinged surface. Surface enlargement done by microscopic features only slightly improves the overall performance of the jet device since they create zones of recirculation and zero flow. For example, in Hansen and Webb, 1993, improvement factors of 1.5 to 4 are seen for surface enlargement.

A problem also associated with conventional jet impingement coolers that heat may generally only be removed through the contact between coolant fluid and hot surface and that no heat may be conducted to the upper part of the cooler where also a jet plate or manifold structures could contribute to the heat exchange. Furthermore, when utilizing parallel manifold structures in conventional jet impingement coolers there is a notable increase in pressure drop in the manifold as nozzle pitch decreases. Thus, conventional manifold structures do not function adequately at the required reduced physical scales.

It is an aim of the present invention to provide an arrayed cooling device which mitigates the problems of the known art.

SUMMARY OF THE INVENTION

According to a first aspect of the present invention there is provided an impingement cooler having a first level adjacent an impingement gap, and the first level comprises a layer of substantially parallel inlets and outlets in a distributed array adjacent the impingement gap, and the first level further comprises a layer of interdigitated branched channels to supply the inlets with a fluid and drain the outlets of the fluid.

Preferably, a second level is in contact with the first level and the structure of the second level is substantially a replicate of the structure of the first level enlarged by a predetermined factor.

Preferably, further hierarchical levels are in contact with the second level, and the structure of the further levels is substantially a replicate of the structure of the second level and enlarged by the predetermined factor. Advantageously, this hierarchical structure for parallel levels, also known as manifolds, may optimally mitigate pressure accumulation and flow distribution issues when feeding coolant fluid to the scaled down impingement arrays.

The layer of interdigitated input channels and output channels comprises a separation wall forming interlocking digits.

Preferably, the predetermined enlargement factor ranges from 5-15.

The inlets and outlets of at least one layer may have a substantially cylindrical form or a substantially slot form.

Preferably, the distributed array has a face centered square pattern of the inlets and the outlets.

The impingement cooler may have surface enhancement features positioned within the impingement gap attached to at least one of the first level and a heated body, wherein the surface enhancement features comprise a plurality of protrusions. Advantageously, the surface enlargement features enhance heat exchange. Where the surface enhancement features extend between the target surface and the jet plate a conductive path is formed which extends to the upper part of the cooler where also the jet plate or manifold structures could contribute to the heat exchange.

The surface enhancement features may comprise a plurality of protrusions each having a diamond-shaped form, regularly positioned between inlets and outlets of the first level, and the arrangement of the protrusions substantially directs flow away from stagnation zones.

The surface enhancement features may further comprise barrier features regularly positioned along diagonals joining the inlets and outlets of the first level. Advantageously, stagnation points in the impingement gap are substantially eliminated.

The surface enhancement features may comprise a plurality of linear parallel protrusions positioned diagonally such that inlets and outlets of the first level are alternately located in a linear gap between the protrusions.

Preferably, the linear parallel protrusions are attached between the first level and the heated body, and modified to form a plurality of microchannels each joining a single inlet and a single outlet. Advantageously, this structure forms a direct conductive path from the heated body to the jet plate, thereby further contributing to the thermal exchange. Also, this embodiment allows relatively short separation of the inlets and outlets which may enable the chip itself to function as a heat spreader.

Preferably, the impingement cooler has a first group of microchannels supplied and drained from a primary channel loop and a second group of microchannels supplied and drained from a secondary channel loop, wherein the operation of the first and second loops is independent of each other.

Preferably, the microchannels of the first group and the microchannels of the second group are positioned substantially alternately within the distributed array.

The surface enhancement features may further comprise barrier features regularly positioned between the inlets and outlets of the first level in the linear gaps.

Each barrier feature may be sub-divided into a plurality of barriers positioned substantially along lines of flow.

The surface enhancement features may comprise a plurality of chevron-form protrusions positioned such that inlets and outlets of the first level are alternately located in a chevron-form gap between the protrusions.

According to a second aspect of the present invention there is provided a method for transferring heat away from a heat source, and the method comprising a providing step for providing an impingement cooler having a first level adjacent an impingement gap, the first level comprising a layer of inlets and outlets in a distributed array, wherein the inlets and outlets branch from a layer of interdigitated input channels and output channels, and having the impingement cooler in contact with the heat source via the impingement gap, and an impinging step for impinging coolant fluid through the impingement cooler and onto the heat source via the impingement gap, resulting in a minimal pressure drop across the impingement cooler. Advantageously, this method for supplying coolant flow to a target surface on a microprocessor chip minimises pressure drop across the impingement cooler.

BRIEF DESCRIPTION OF THE DRAWINGS

Embodiments of the present invention will now be described, by way of example only, with reference to the accompanying drawings in which:

FIG. 23 schematically illustrates an alternative embodiment of a portion of an impingement cooler, where

DETAILED DESCRIPTION OF PREFERRED EMBODIMENTS OF THE INVENTION

Figure 1:
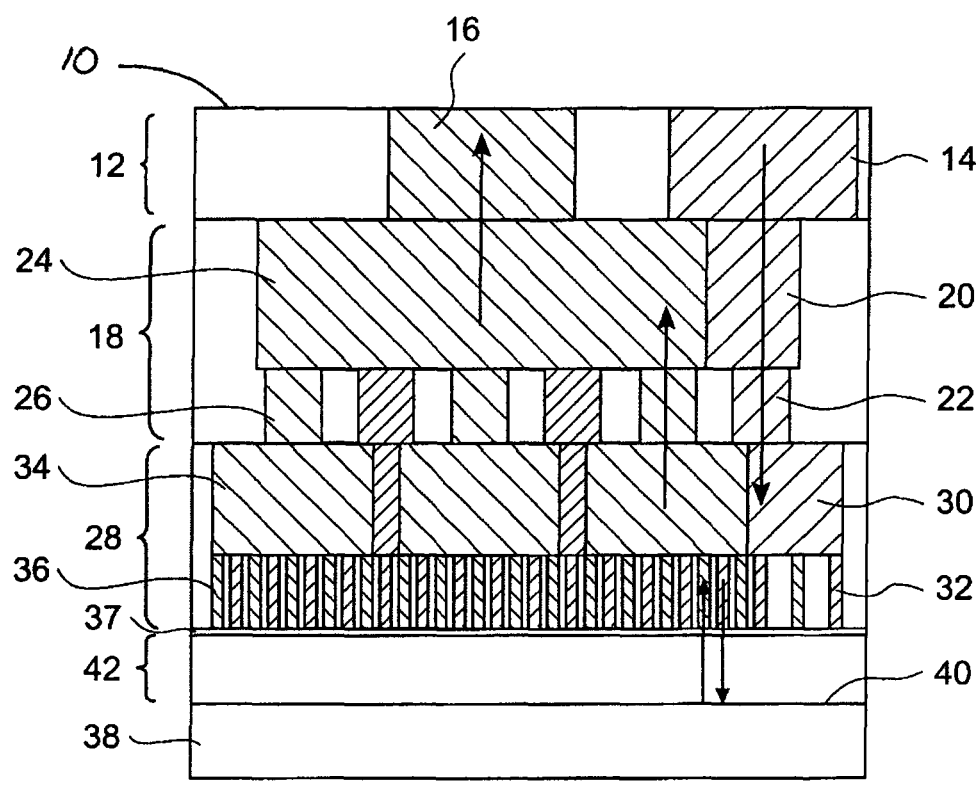
FIG. 1 shows a cross-sectional view of a portion of an impingement cooler 10 of the present invention.

FIG. 1 shows a cross-sectional view of a portion of an impingement cooler 10 of the present invention. A third level 12 of the impingement cooler 10, also known as an interface layer, comprises a third level inlet 14 and a third level outlet 16. Adjacent to the third level 12 is a second level 18, also known as a manifold layer, comprising a second level manifold input channel 20 connected to several second level inlets 22, and a second level manifold output channel 24 connected to several second level outlets 26. Adjacent to the second level 18 is a first level 28, also known as a jet layer or terminal level, comprising a first level input channel 30 connected to several jet nozzles or first level inlets 32, and a first level output channel 34 connected to several output nozzles or first level outlets 36. The first level inlets 32 and the first level outlets 36 terminate at a jet plate 37. Preferably, the first level inlets 32 and the first level outlets 36 are parallel. A backside of a microprocessor chip 38, known as a target surface 40, is separated from the jet plate 37 by an impingement gap 42.

Figure 2:
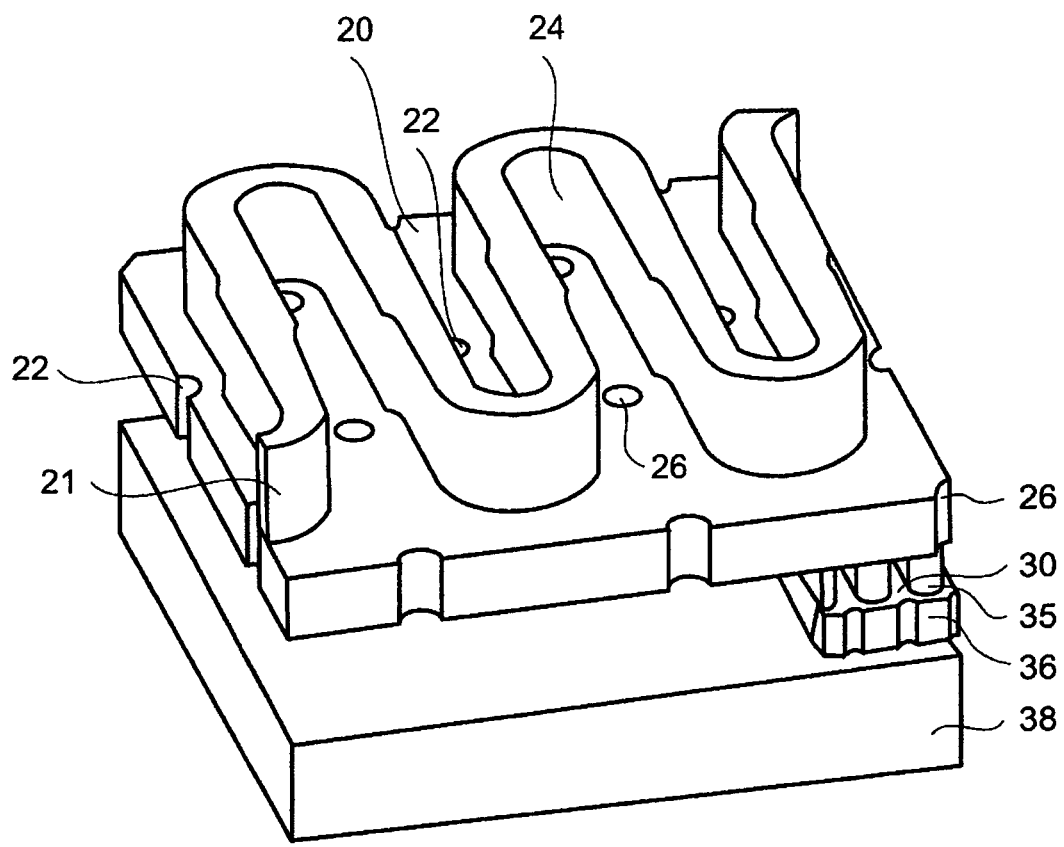
FIG. 2 illustrates a three dimensional view of a portion of the impingement cooler 10 of FIG. 1, although the third level, as described above, is not illustrated.

FIG. 2 illustrates a three dimensional view of a portion of the impingement cooler 10 of FIG. 1, although the third level, as described above, is not illustrated. A meandering second level separation wall 21 separates the second level manifold output channels 24 and the second level manifold input channels 20, thereby resulting in an interdigitated formation. Second level outlets 26 and second level inlets 22 are positioned below a second level manifold output channel 24 and a second level manifold input channel 20, respectively. Similarly, a meandering first level separation wall 35 separates the first level output channels 34 and the first level input channels 30, also resulting in an interdigitated formation, although reduced in size relative to the second level features. First level outlets 36 and first level inlets 32 are illustrated and are positioned relative to the first level input channels 30 and first level output channels 34 in a similar formation to the second level. The microprocessor chip 38 is illustrated. Overall, it is shown that there is a hierarchy of input channels and a hierarchy of output channels which are interdigitated.

The relative number of input channels in subsequent levels is called the scale factor, sf. For example, with reference to FIG. 1, where each second level inlet 22 feeds five first level inlets 32 via the first level input channels 30, the sf is five.

In operation, coolant enters the impingement cooler 10 at the third level inlet 14 and is split into sf^2 paths to feed the second level manifold input channels 20. The coolant then flows through the second level inlets 22 to the first level input channels 30 before being ejected through one of the multiple first level inlets 32 and impinging on the target surface 40. The coolant then absorbs thermal energy generated by the heated body, generally a microprocessor chip 38, and drains away from the impingement gap 42 through one of the multiple first level outlets 36. After passing through a first level output channel 34, the coolant enters a second level outlet 26 and then a second level manifold output channel 24 and finally flows into the third level outlet 16.

Figure 3:
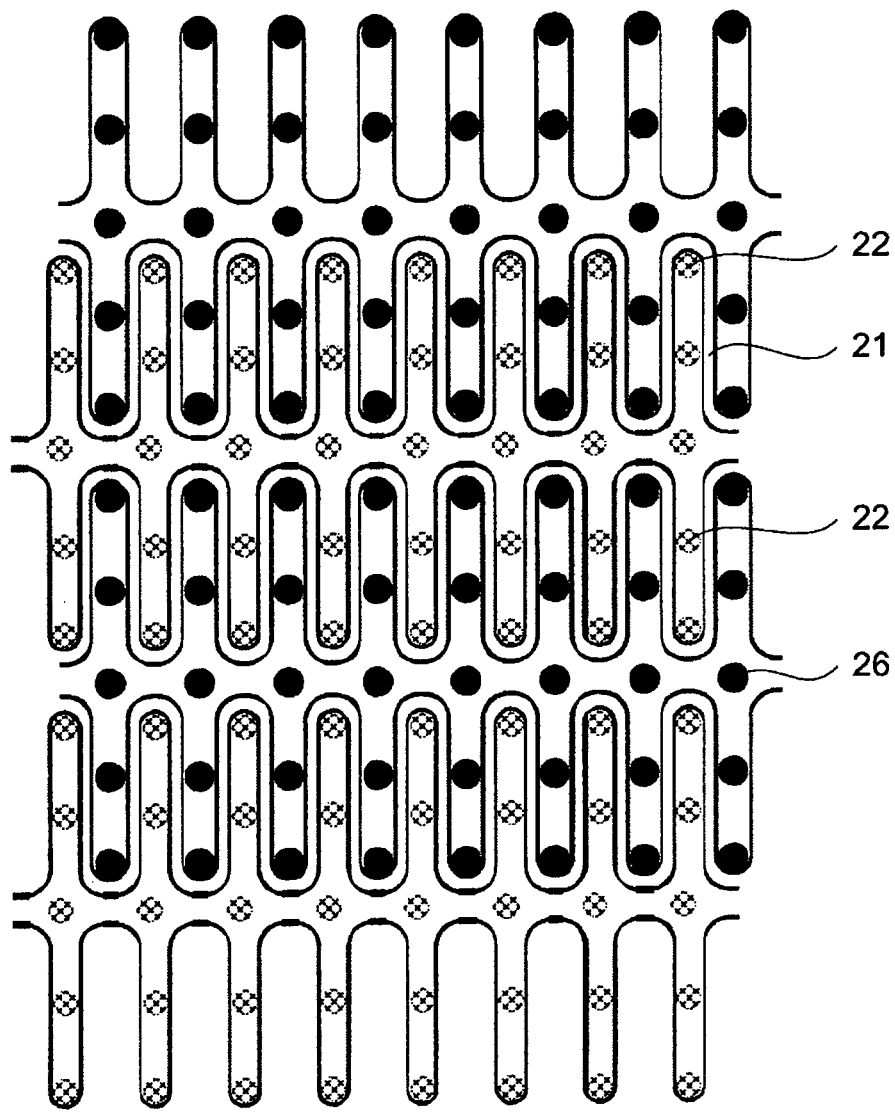
FIG. 3 schematically illustrates a plan view of the second level 18 of a preferred embodiment of the impingement cooler 10.

FIG. 3 schematically illustrates a plan view of the second level 18 of a preferred embodiment of the impingement cooler 10.

A plurality of second level separation walls 21, each of the form described with respect to FIG. 2, are positioned in rows. Separation walls 21 of neighboring rows have a mirror-image layout. The position of the second level manifold outlets 26 and second level inlets 22 between the winding separation walls 21 are shown. The relationship between the second level manifold outlets 26 and the second level inlets 22 is a face centered square layout. For example, where the approximate diameter of the second level inlets is 28 microns, the approximate diameter of the second level manifold outlets is 40 microns.

Preferred embodiments of the impingement cooler are not restricted to three levels as illustrated in FIG. 1. A greater or lesser number of levels may be utilized. The level adjacent the jet plate 37 may be referred to as the terminal level from herein.

The overall design of the levels within the impingement cooler 10 determines the pressure drop experienced in the device, and hence the performance of the device. In addition to the sf, further factors that can be determined are nozzle pitch, pit, jet nozzle diameter, ri, output nozzle diameter, ro, channel depth i.e., the thickness of a channel layer, b, and wall thickness between the hierarchy of input channels and a hierarchy of output channels, wall. An effective hydrodynamic radius of a first level inlet channel 32 is calculated with width 2.0*ri and with depth b.

A theoretical pressure drop in a fluid flowing with a given volumetric rate in a first level inlet 32, scales with viscosity, flow, length and the inverse fourth power of the channel effective hydrodynamic radius. The theoretical pressure drop experienced across an impingement cooler can be calculated using the following protocol. Specifically, the overall resistance, p, the first to third layers of the impingement cooler is calculated as the sum of resistances of all partial input or output channels with their respective flows:

$$p(ri, ro, N, pit, b, sf) :=$$

$$\frac{8 \cdot \eta \cdot \text{Flow}}{N} \left[ \frac{1}{ri^4} + \frac{1}{ro^4} + \frac{sf^2 \cdot pit \cdot \left(\frac{sf}{2} - 1\right)}{\left(\frac{2 \cdot 2.5 \cdot ri \cdot b}{2.5 \cdot ri + b}\right)^4} + \frac{sf^2 \cdot pit \cdot \left(\frac{sf}{2} - 1\right)}{\left(\frac{2 \cdot 2.5 \cdot ro \cdot b}{2.5 \cdot ro + b}\right)^4} + \right.$$

$$\left. \frac{sf \cdot pit \cdot \left(\frac{sf}{2} - 1\right)}{\left(\frac{2 \cdot 2.5 \cdot ri \cdot b}{2.5 \cdot ri + b}\right)^4} + \frac{sf \cdot pit \cdot \left(\frac{sf}{2} - 1\right)}{\left(\frac{2 \cdot 2.5 \cdot ro \cdot b}{2.5 \cdot ro + b}\right)^4} \right]$$

In this protocol, N is the total number of terminal level outlets and η is the kinematic viscosity.

The protocol assumes that the width of a terminal level inlet, which is also known as a jet channel, and the width of the jet nozzles that are fed from it are similar, excepting that it is further assumed that at the end of such a jet channel its width becomes relatively increased as coolant flow from more than one jet nozzle is accumulated. The overall performance is approximated by use of a 25% larger channel width and an average channel length of sf/2−1. While this equation may not calculate the pressure drop accurately, it can help to select a preferred layout, the appropriate scaling factor, and the dimensions of the terminal level inlets and outlets.

Thus it can be calculated that the theoretical overall pressure drop of the impingement cooler may be reduced by increasing the size of the output nozzle and the terminal level inlet relative to the jet nozzle diameter by thirty percent. Thus the pressure drop of the output channels is reduced 2.8 fold compared with the input channels.

In addition to the flow resistance in the channels, the pressures for 90 degree bends can be taken into account. The pressure is due to the deceleration and acceleration of the fluid and depends, therefore, on the square of the average velocity and the density of the fluid. For sharp corners, 2-3 times more pressure drop is generated than for bends with a radius larger than the tube diameter.

The overall resistance of the impingement cooler is calculated by summing the resistance of each of the levels of the impingement cooler.

Figure 4:
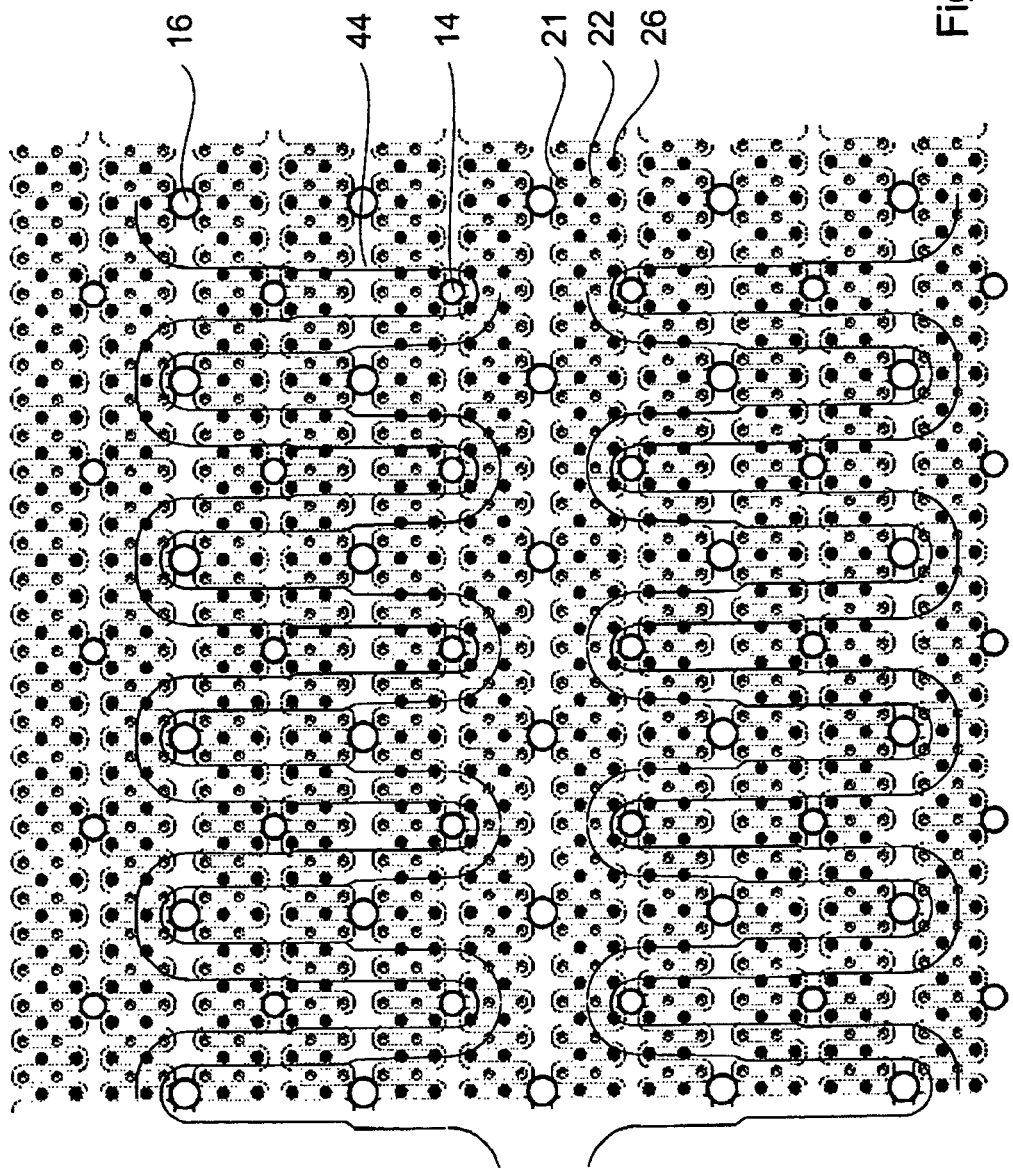
FIG. 4 depicts two levels of a preferred embodiment of an impingement cooler 10 having sf of 5.

FIG. 4 depicts two levels of a preferred embodiment of an impingement cooler 10 having sf of 5. Whilst a single level is shown to have a similar layout to the level illustrated in FIG. 3, the structure of further levels are superimposed.

Specifically, two rows of third level separation walls 44 are illustrated as the largest winding forms with associated third level outlets 16 and third level inlets 14. Numerous rows of second level separation walls 21 are superimposed with associated second level inlets 22 and second level outlets 26. The third level is not shown. In this embodiment, the third level inlets 14 have a diameter five times greater than the second level inlets 22. For example, the second level inlets may have a diameter of 28 microns and the third level inlets may have a diameter of 36 microns. This combination of nozzle diameters may reduce the overall pressure drop in the cooler, while maintaining a relatively improved jet impingement performance.

It is noted that where a third level inlet 14 is coaxial to a second level inlet 22, then the third level inlet 14 experiences relatively poor drainage characteristics and has a relatively small pressure drop. This reduced pressure drop can be explained because of the direct path traveled by the coolant, in contrast to traveling along an indirect path having three 90 degree bends where the third level inlet 14 is not coaxial to the second level inlet 22. Specifically, the indirect path would be from the third level inlet 14 to the perpendicular flow to the second level manifold input channel 20 entailing a further 90 degree bend and then a third 90 degree bend into the second level inlet 22. For example, where such an indirect coolant path is taken the pressure drop in the third level inlet 14 may be 200 Pascals, and in the second level inlet 22 the pressure drop may be 11000 Pascals.

In a preferred embodiment of the impingement cooler 10, the 90 degree turns throughout the hierarchy of input channels and hierarchy of output channels may have a curved profile with a curve radius approximately twice the channel diameter. In this way, a bending back-pressure may be reduced.

Figure 5:
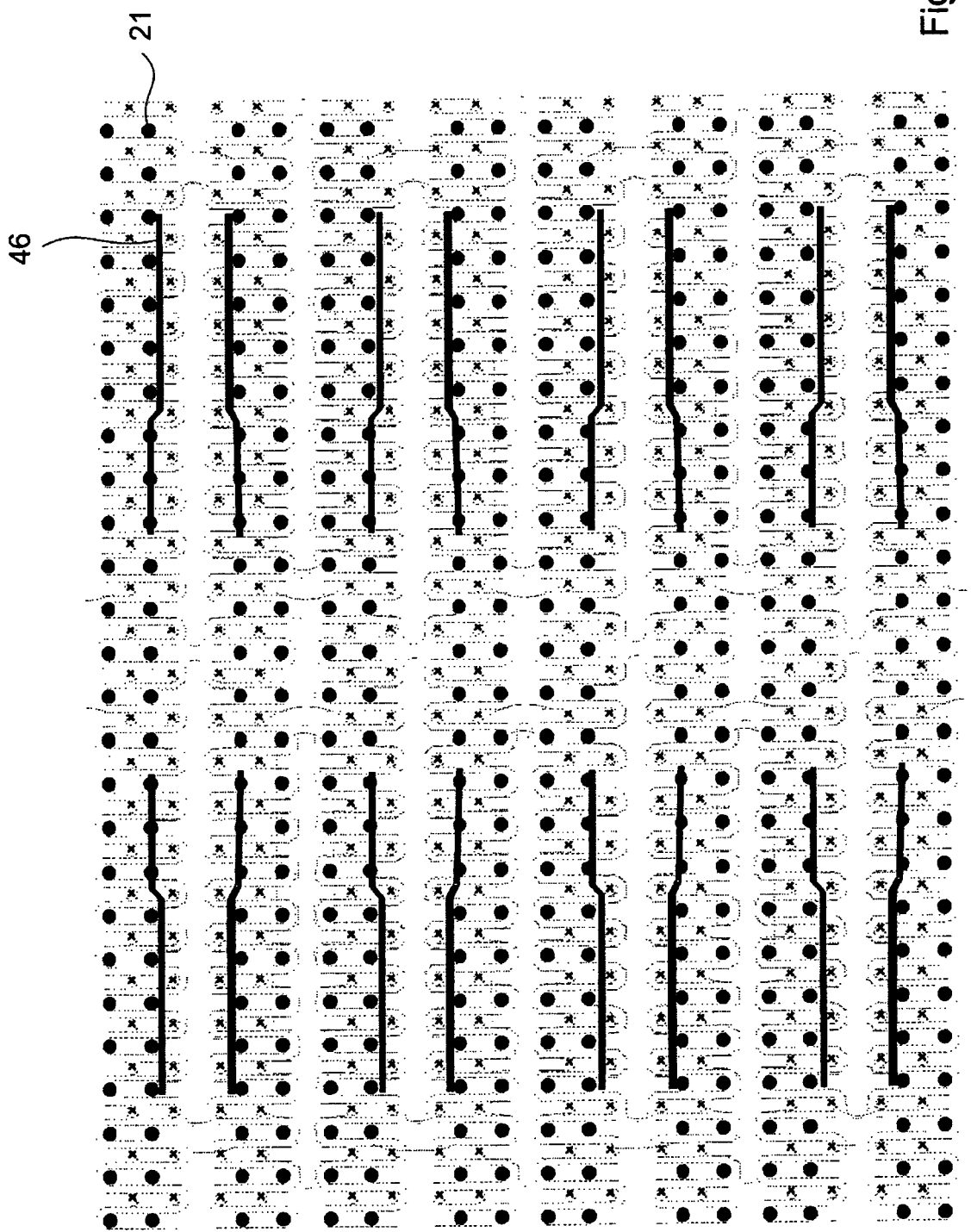
FIG. 5 illustrates two levels of an alternative embodiment of an impingement cooler 10.

FIG. 5 illustrates two levels of an alternative embodiment of an impingement cooler 10. The second level 18 is shown to have a similar layout to the level illustrated in FIG. 3 and the structure of the third level 12 is superimposed. Specifically, the first level inlets and outlets are comprised of an array of slots 46 instead of an array of cylindrical channels. The larger hydraulic radius of slots 46 allows a reduction of the Poiseuille flow related pressure drop. The array of slots 46 may also eliminate two rectangular turns in some flow paths thereby contributing to a further reduction in pressure drop. In the preferred embodiment illustrated, the third level 12 has two rows of first level separation walls 44 positioned perpendicular to the second level rows and thus the interdigitated structure between adjacent levels is rotated by 90 degrees.

Figure 6:
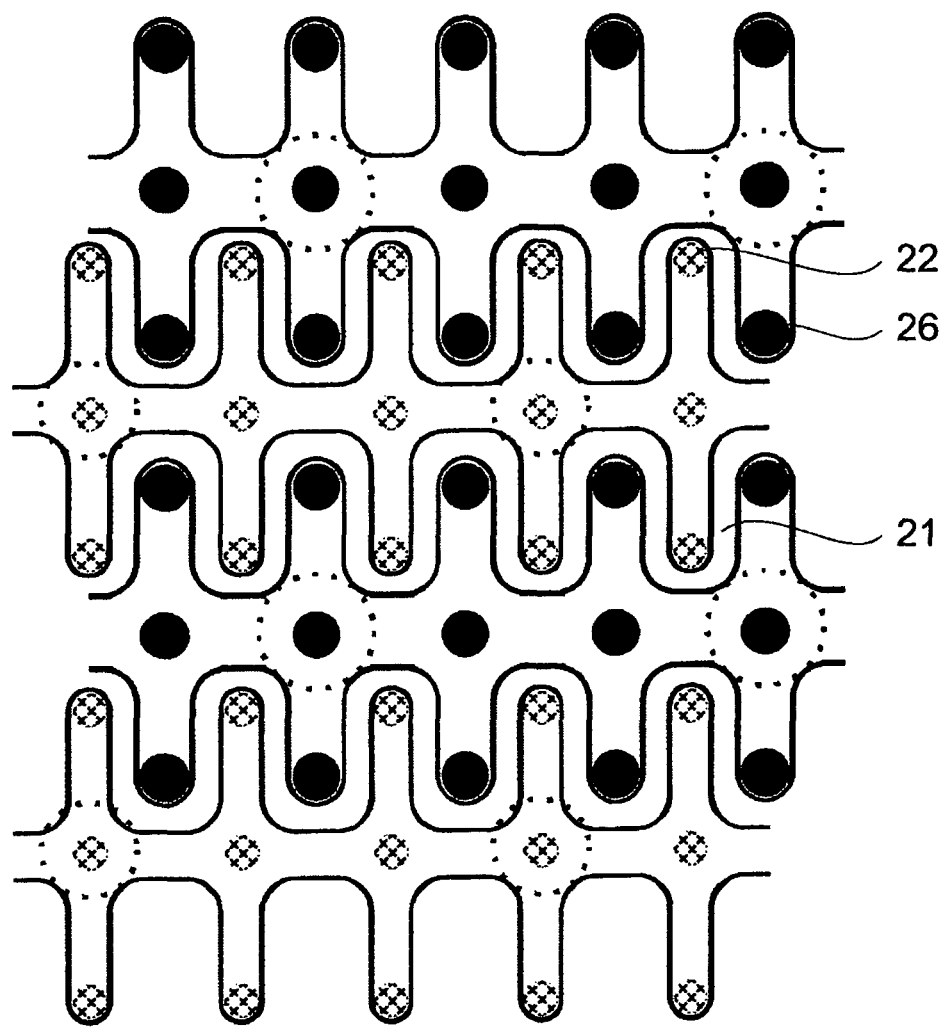
FIG. 6 schematically illustrates a plan view of a second level 18 of a further embodiment of an impingement cooler.

FIG. 6 schematically illustrates a plan view of a second level 18 of a further embodiment of an impingement cooler. For example, where sf is 3 and P is 150 microns, the approximate diameter of the second level inlets may be 40 microns, the approximate diameter of the second level outlets may be 52 microns.

Figure 7:
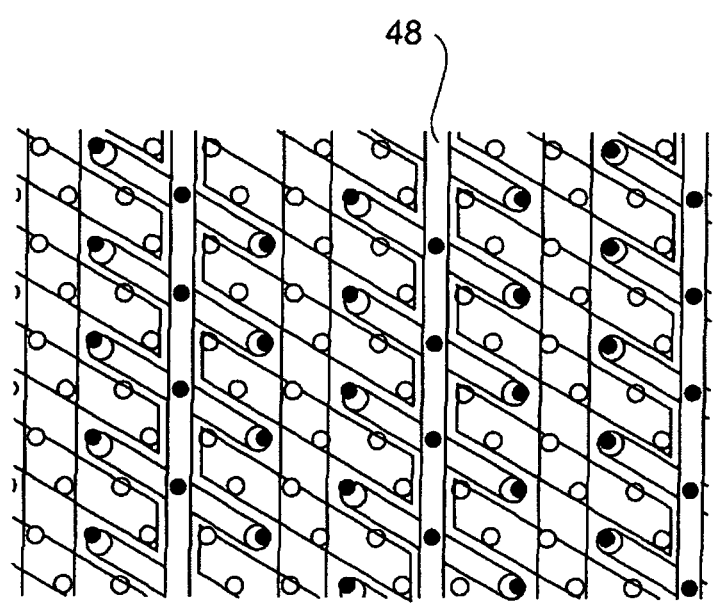
FIG. 7 depicts a first level of an alternative geometry of an impingement cooler, namely, the first level inlets 32 and the first level outlets 36 are in a hexagonal layout.

FIG. 7 depicts a first level of an alternative geometry of an impingement cooler, namely, the first level inlets 32 and the first level outlets 36 are in a hexagonal layout. The winding structure of the first level separation wall is replaced by a tree form structure 48 having a central trunk and regular branching sections. Parallel supply and drainage of a hexagonal lattice of inlets may be achievable. In a preferred layout the number of terminal level outlets is a factor of two times lower than the number of terminal level inlets, which enable the design of two interdigitated feed and drainage networks without flow collisions.

Advantageously, the overall pressure drop across the above described impingement cooler embodiments is reduced through utilization of the hierarchy of input channels and a hierarchy of output channels interwoven with each other. A further measure to provide efficient thermal transfer is the addition of surface enhancement features located in the impingement gap of an impingement cooler.

Figure 8:
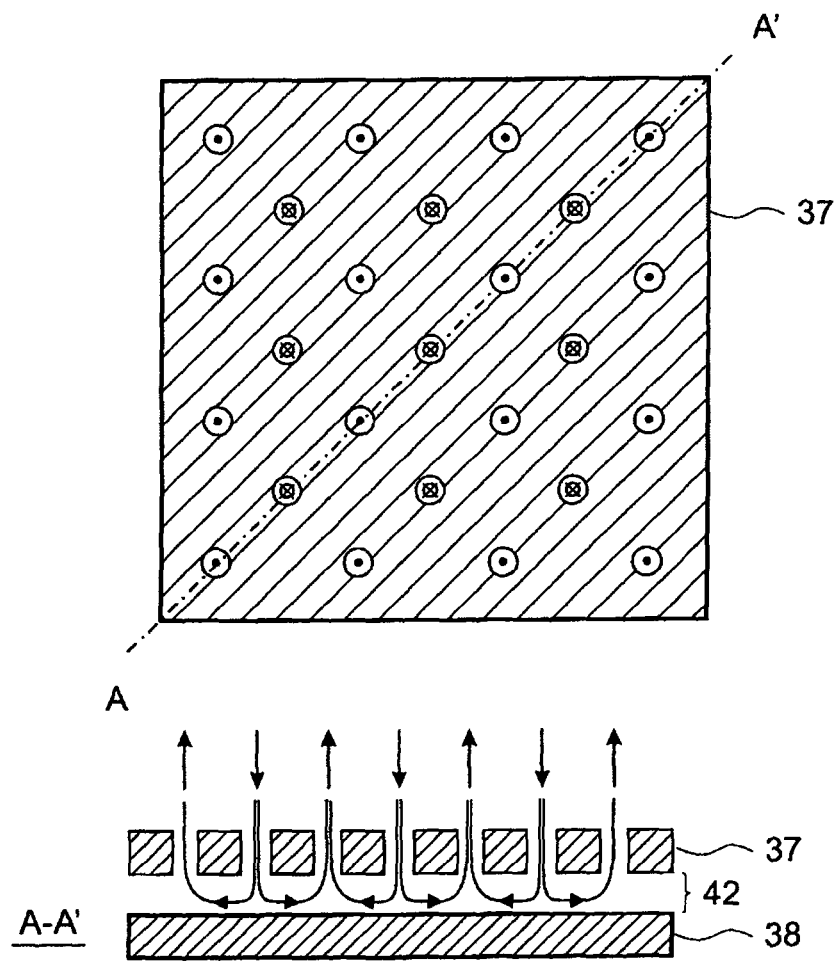
FIG. 8 illustrates a plan view of the jet plate 37 and a cross-sectional view along line A-A' also showing the chip 38

FIG. 8 illustrates a plan view of the jet plate 37 and a cross-sectional view along line A-A' also showing the chip 38 and indicating the distributed return of coolant flow.

Figure 9:
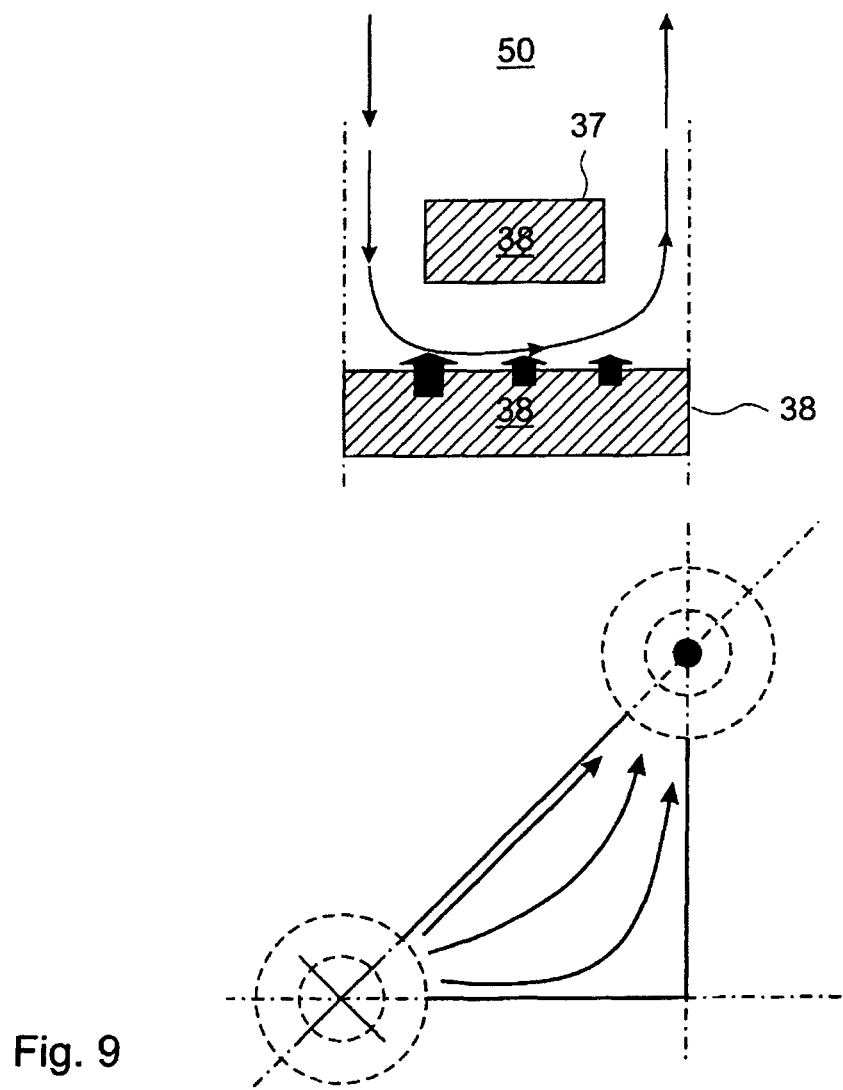
FIG. 9 illustrates a cross-sectional view of an individual impingement cell

FIG. 9 illustrates a cross-sectional view of an individual impingement cell 50, with coolant flow indicated by the line arrows and thermal transfer indicated by the solid arrows. Greater thermal transfer occurs in flow nearer to a terminal level inlet than a terminal level outlet. Also illustrated is a plan view of the terminal level inlet, denoted by a cross and the terminal level outlet, denoted by a solid circle. Flow lines are shown within the area delimited by symmetry planes of the individual impingement cell.

Figure 10:
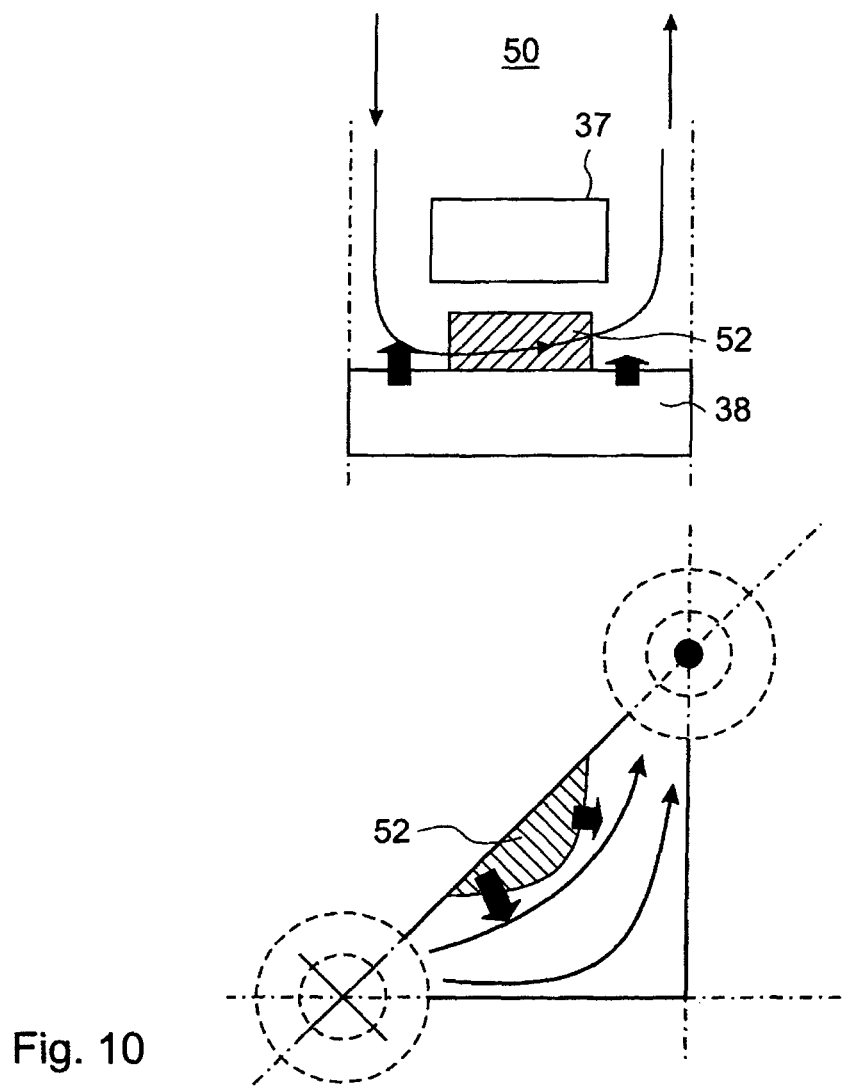
FIG. 10 illustrates a cross-sectional view of an individual impingement cell having a surface enhancement feature attached to a target surface.

Similarly, FIG. 10 illustrates a cross-sectional view of an individual impingement cell 50, with coolant flow indicated by the line arrows and thermal transfer indicated by the solid arrows. A surface enhancement feature 52 is attached to the target surface 40. Again, greater thermal transfer occurs in flow nearer to a terminal level inlet than a terminal level outlet. Also illustrated is a plan view of the terminal level inlet and the terminal level outlet and thermal transfer from the surface enhancement feature 52 to the coolant indicated by the solid arrows.

Figure 11:
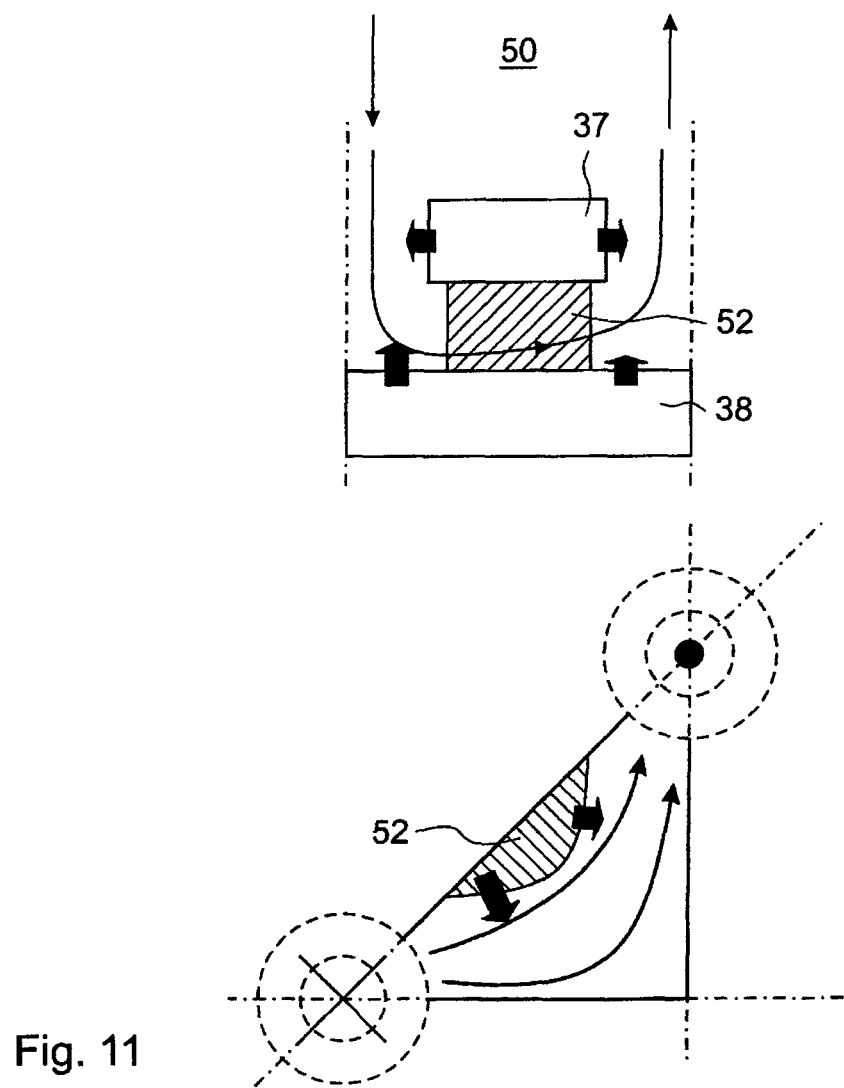
FIG. 11 also illustrates a cross-sectional view of an individual impingement cell having a surface enhancement feature attached between the target surface and the jet plate.

FIG. 11 also illustrates a cross-sectional view of an individual impingement cell 50, with coolant flow indicated by the line arrows and thermal transfer indicated by the solid arrows. A surface enhancement feature 52 is attached between the surface of the chip 38 and the face of the jet plate 37, thus providing thermal connectivity between those two features. Here, thermal transfer also occurs from the jet plate 37 into the coolant. Also illustrated is a plan view of the terminal level inlet and the terminal level outlet and thermal transfer from the surface enhancement feature 52 to the coolant indicated by the solid arrows.

Figure 12:
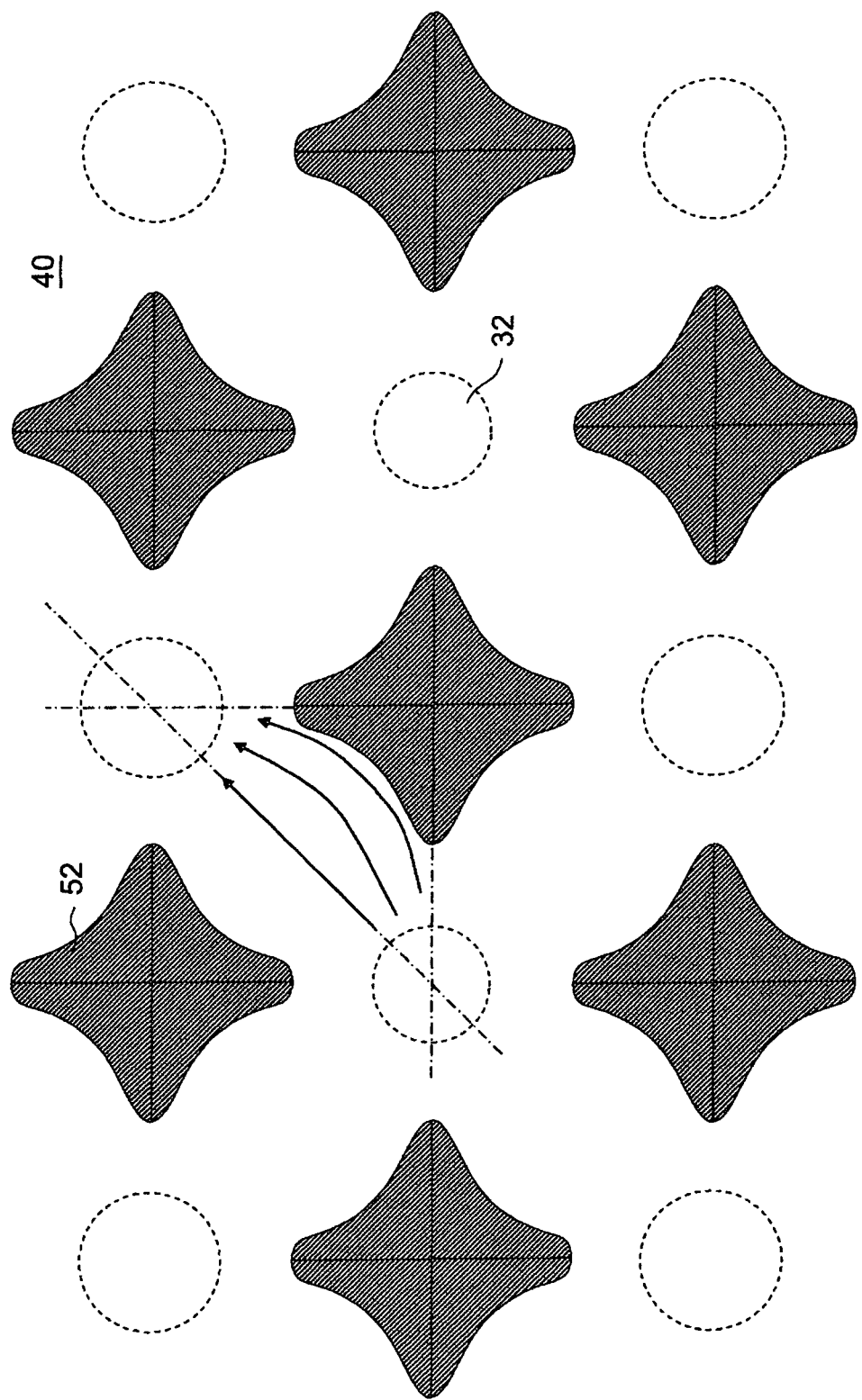
FIG. 12 schematically illustrates a plan view of diamond-shaped surface enhancement features 52 located on a target surface of a chip 40 in a regular pattern between the terminal level inlets 32 and outlets 36.

FIG. 12 schematically illustrates a plan view of diamond-shaped surface enhancement features 52 located on a target surface of a chip 40 in a regular pattern between the terminal level inlets 32 and outlets 36.

In operation, coolant flows out of the terminal level inlets 32, along flow paths indicated by the line arrows, and exits through the terminal level outlets 36. The flow paths are generally in proximity to the target surface 40 or surface enhancement features 52, thus thermal transfer from the target surface 40 to the coolant is relatively improved due to the enlarged surface area with which the coolant is in contact. For example, where surface enhancement features illustrated in FIG. 12 are located in an impingement gap of 50 microns, then the surface area for thermal exchange is approximately four times larger than for a flat target surface. In embodiments having surface enhancement features forming direct thermal contact between the target surface 40 and the jet plate 37, a path for thermal conduction from the hot chip to the cooler nozzle plate and channel layer is provided. This opens additional paths for thermal transfer from solid surfaces to the fluid, and so with many surface enhancement feature geometries, the amount of heat transferred in the terminal level exceeds the amount of heat transferred by jet impingement and by the surface enhancement features.

Surface enhancement features also function to redirect the flow to avoid formation of flow stagnation points and lines. Also, where the surface enhancement features extend between the target surface 40 and the jet plate 37, they may have a mechanical role in maintaining a uniform impingement gap 42.

The surface enhancement features are preferably shaped such that they present a relatively small flow resistance to impinging coolant and deflect flow away from the stagnation lines by gradual acceleration. For example, in the embodiment illustrated in FIG. 12, the height of the surface enhancement features is 50 microns, i.e., half of the nozzle pitch, a hydraulic radius of the four outlets fed by one inlet and delineated by the diamond shaped patterns is of the order of 40 microns. In such a case, the so-called 'surface enlargement factor' is five. Nozzle pitch refers to the separation of adjacent inlet and outlets at the terminal level.

In a further preferred embodiment, the hierarchy of input channels and the hierarchy of output channels, may each have a length of 50-100 microns and have a hydraulic diameter of the order of 10 microns.

Figure 13:
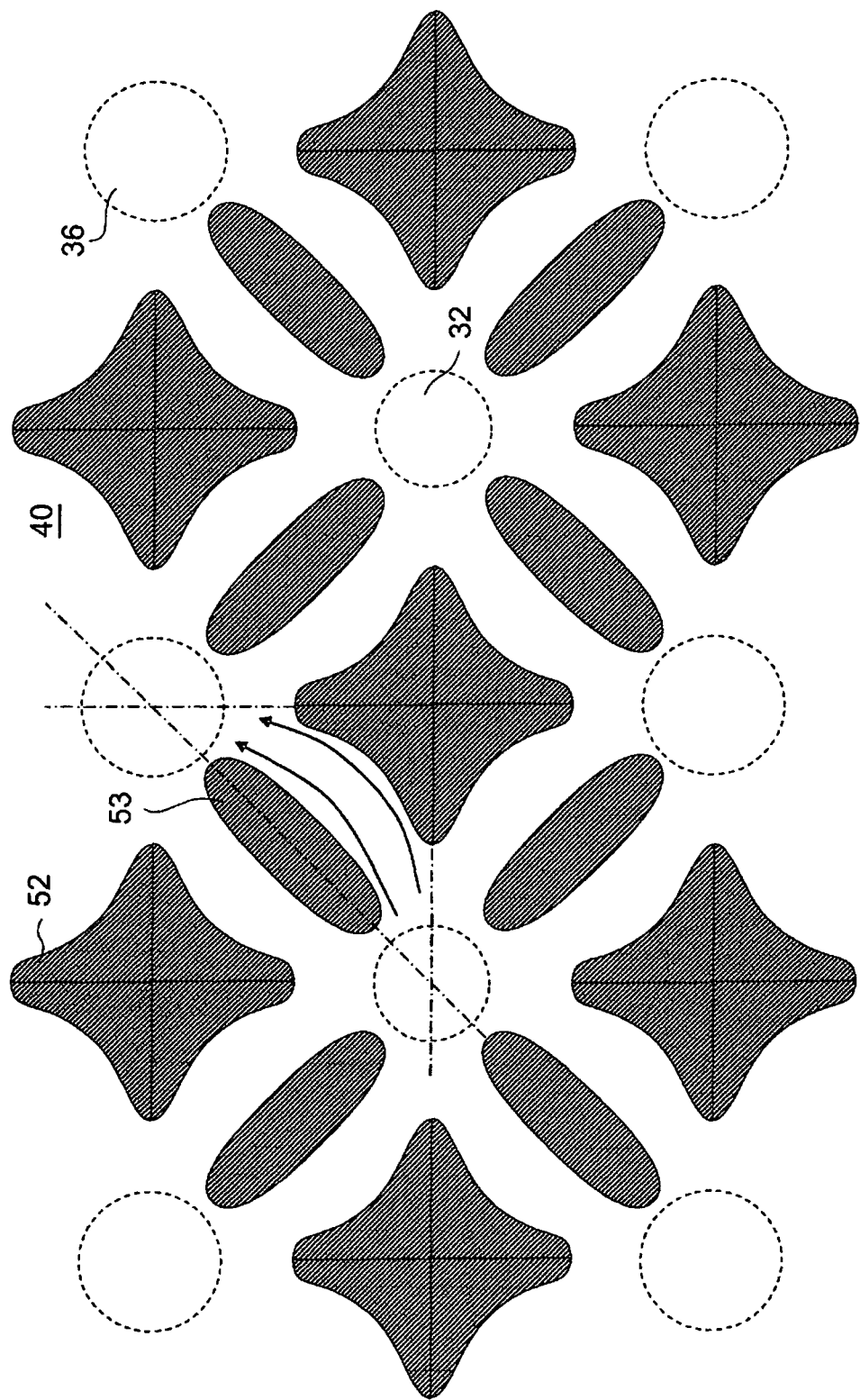
FIG. 13 schematically illustrates a plan view of a preferred embodiment of surface enhancement features FIG. 14 schematically illustrates a plan view of a preferred alternative embodiment of surface enhancement features.

FIG. 13 schematically illustrates a plan view of a preferred embodiment of surface enhancement features. The surface enhancement features 52 are diamond-shaped and may be positioned regularly between inlets 32 and outlets 36. Further surface enhancement features, specifically barrier features 53, have an oval form and have a central axis along the line joining an inlet and an outlet in an individual impingement cell.

In operation, the diamond-shaped features 52 are again positioned to redirect flow to avoid stagnation lines and the elongate oval features 53 function to form two approximately uniform narrow curving flow paths thereby removing the straight central flow path with relatively poor heat transfer. This enlarges the overall surface for heat exchange from 5× to 8-9×, doubles the number of outlets fed by one inlet, and reduces the hydraulic diameter to 28 microns.

Figure 14:
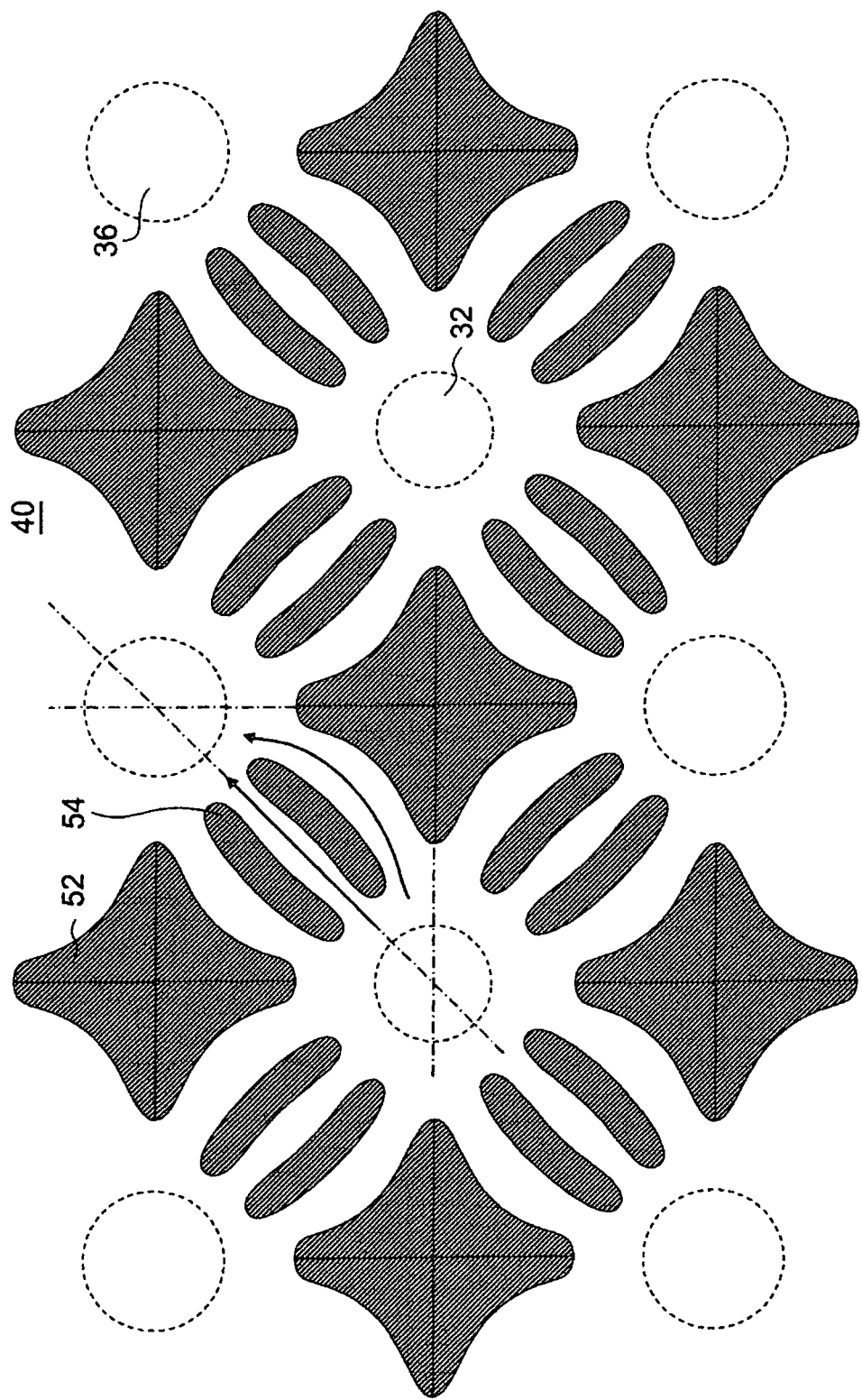

FIG. 14 schematically illustrates a plan view of a preferred alternative embodiment of surface enhancement features. The surface enhancement features are diamond-shaped protrusions 52 positioned regularly between inlets 32 and outlets 36, although not extending to contact inlets or outlets. Two elongate curved narrow protrusions 54 are positioned such that they follow flow lines between an inlet and an outlet of an individual impingement cell.

In operation, the two elongate curved narrow protrusions 54 function to provide yet further surface area for thermal transfer and reduce the hydraulic diameter of the twelve outlets fed by one inlet to values below 15 microns, in such an embodiment. For example, in an embodiment where P is approximately 150 microns, then an elongate curved narrow protrusion may be approximately 10 microns wide.

Figure 15:
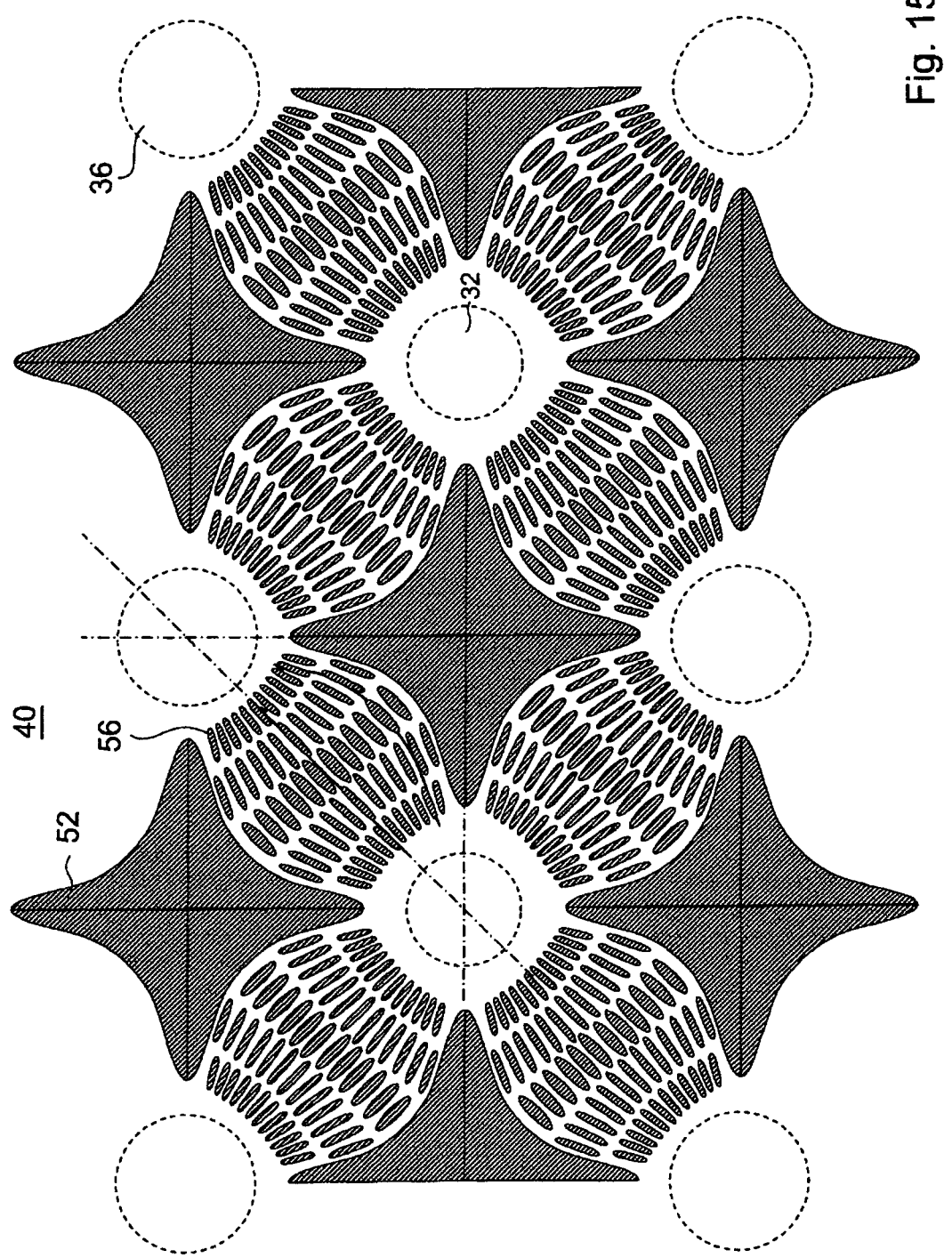
FIG. 15 schematically illustrates a plan view of a further preferred embodiment of surface enhancement features.

FIG. 15 schematically illustrates a plan view of a further preferred embodiment of surface enhancement features. In addition to the diamond-shaped surface enhancement features 52 are numerous oval surface enhancement features positioned regularly between inlets 32 and outlets 36 along the flow lines.

Figure 16:
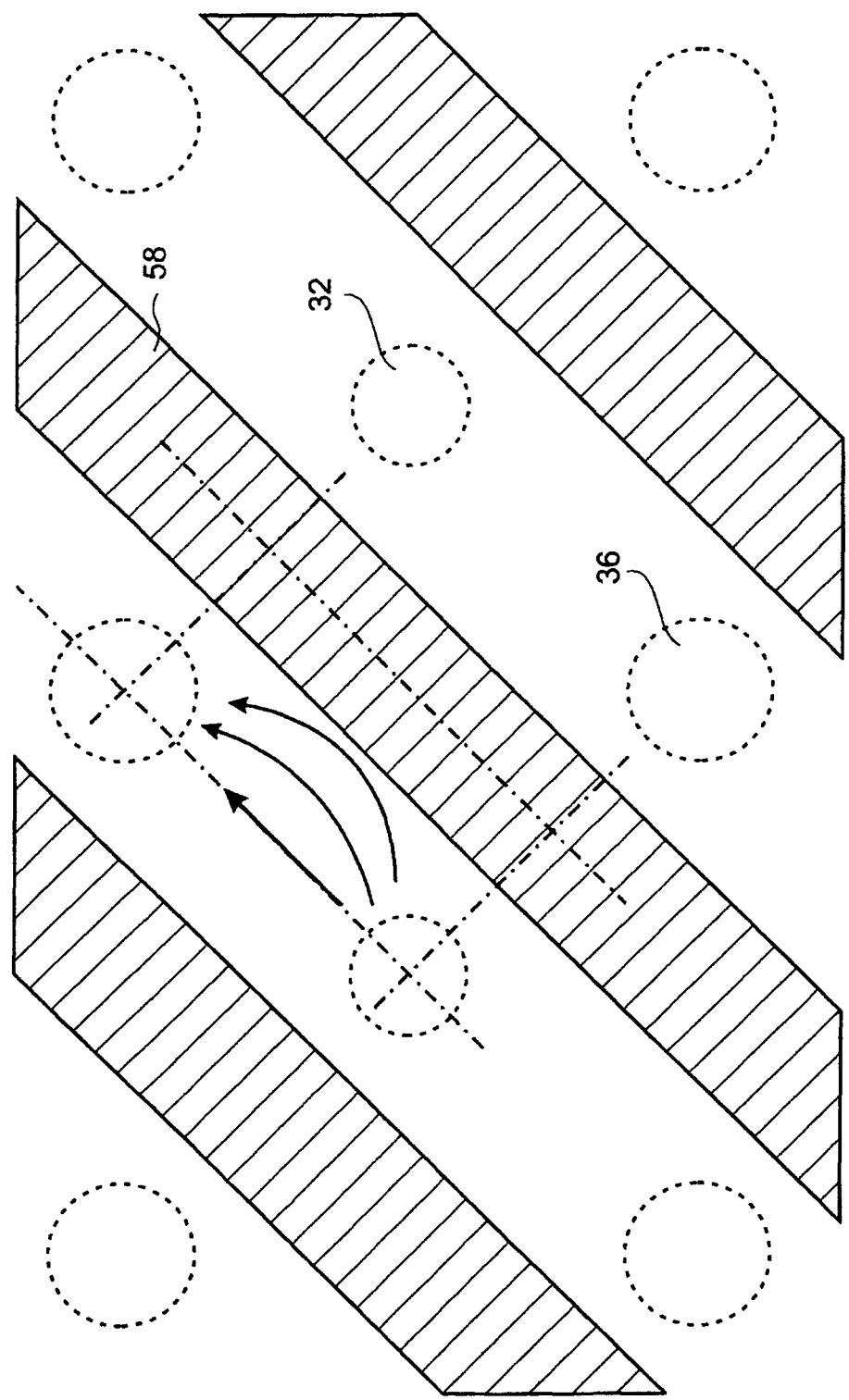
FIG. 16 illustrates a plan view of an alternative embodiment of surface enhancement features.

FIG. 16 illustrates a plan view of surface enhancement features across several impingement cells having linear fins, also known as linear protrusions, 58 that create two parallel paths, also known as linear gaps, from one inlet 32 to two neighboring outlets 36 along one diagonal of the unit cell.

Figure 17:
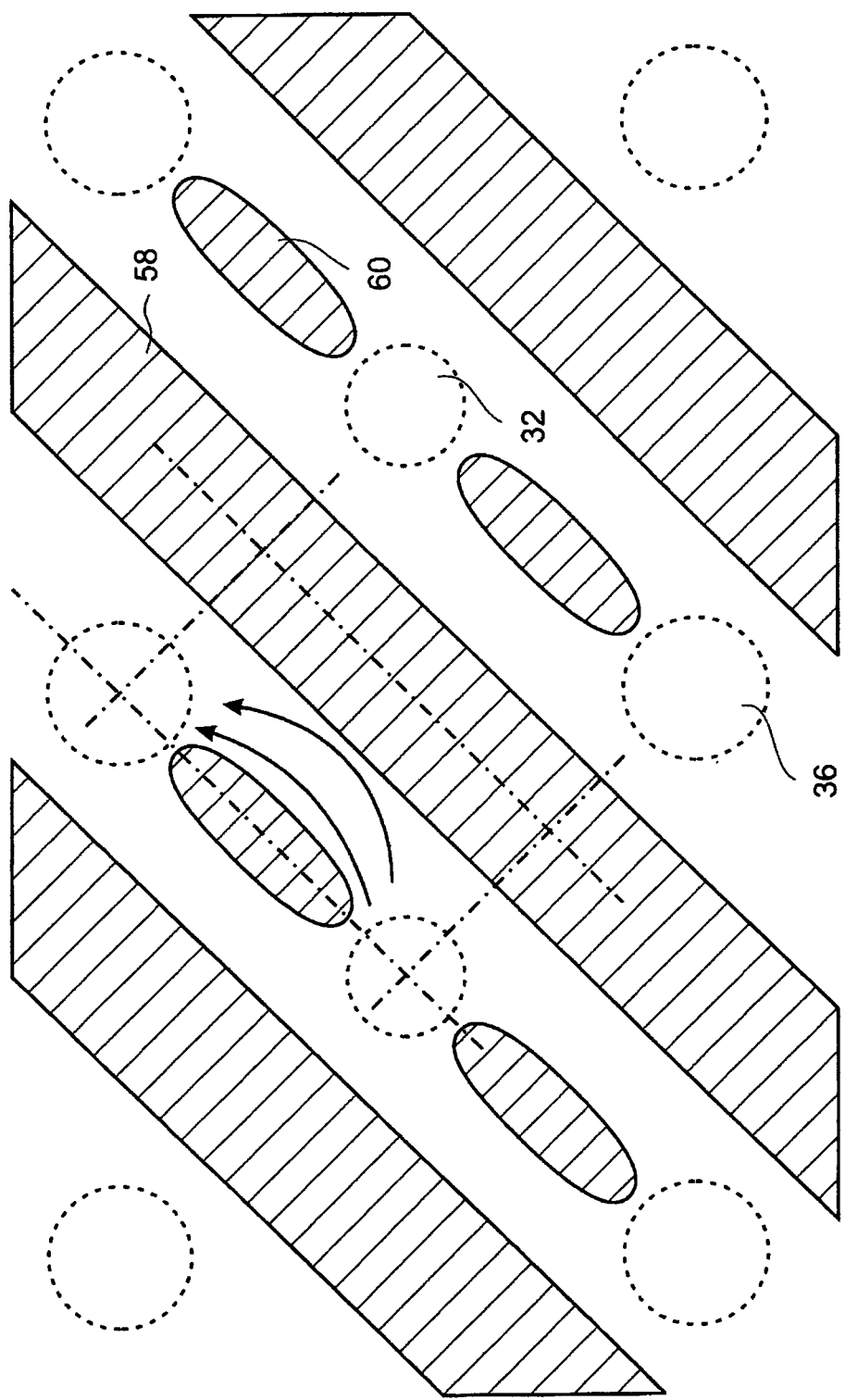
FIG. 17 illustrates a plan view of a further alternative embodiment of surface enhancement features.

FIG. 17 illustrates a plan view of surface enhancement features across several impingement cells having linear fins 58 and additional short oval fins, also known as barrier features 60, positioned to form four paths from one inlet 32 to two neighboring outlets 36.

Figure 18:
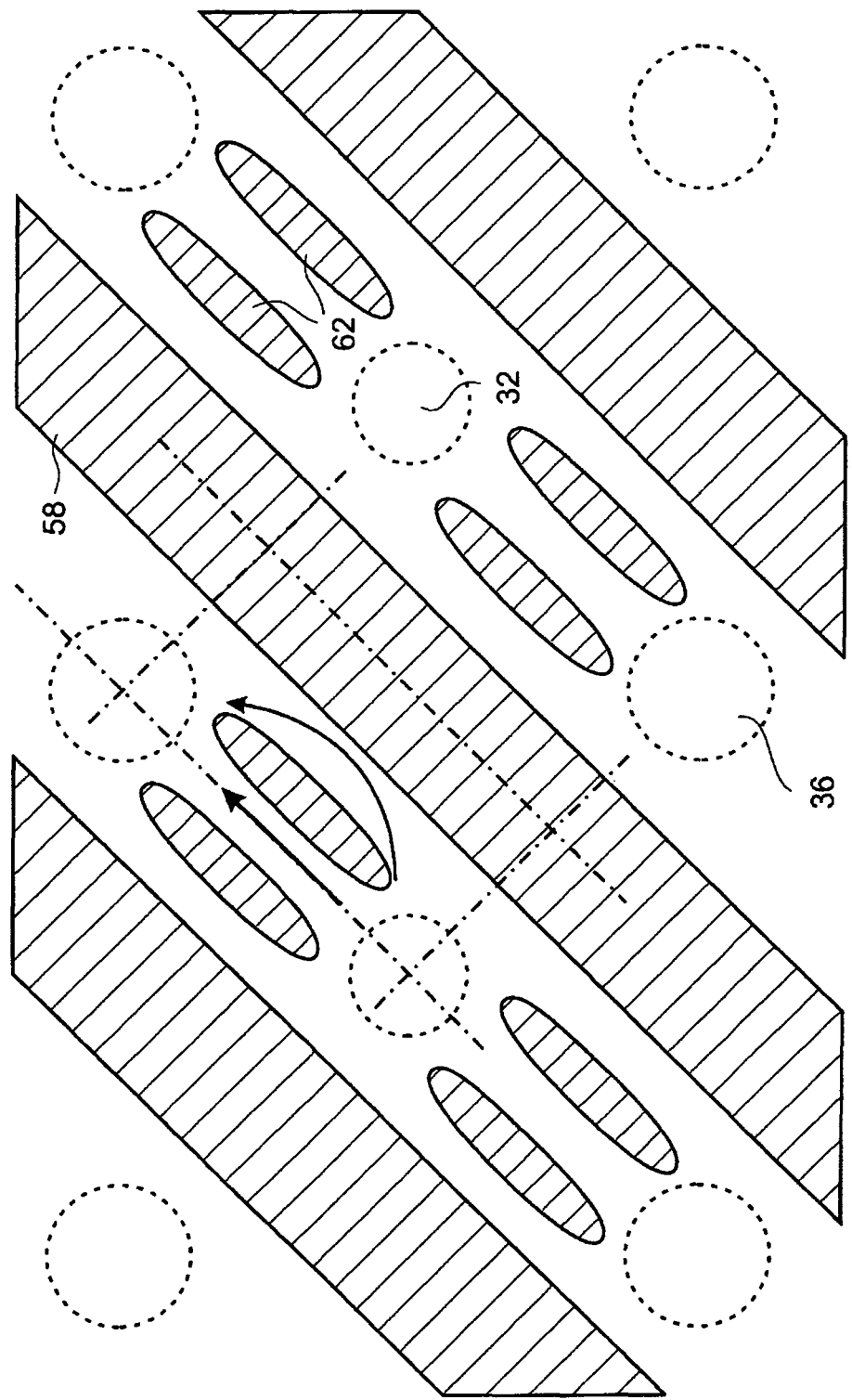
FIG. 18 illustrates a plan view of a further embodiment of surface enhancement features.

FIG. 18 illustrates a plan view of surface enhancement features across several impingement cells having linear fins 58 and a pair of additional short oval fins 62 positioned to form six paths from one inlet 32 to two neighboring outlets 36.

Figure 19:
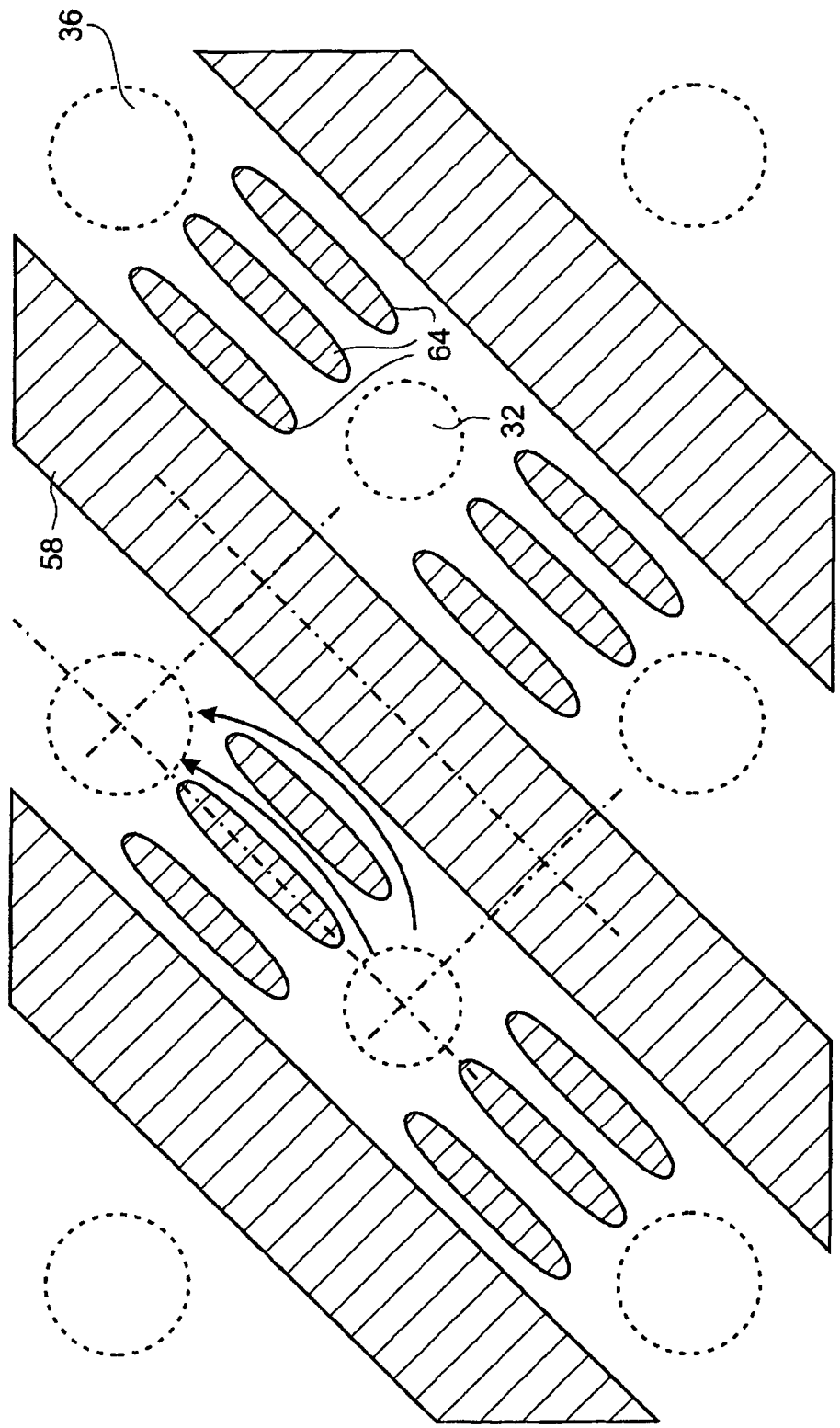
FIG. 19 illustrates a plan view of a preferred embodiment of surface enhancement features.

FIG. 19 illustrates a plan view of surface enhancement features across several impingement cells having linear fins 58 and a three additional short oval fins 64 positioned to form eight paths from one inlet 32 to two neighboring outlets 36.

Figure 20:
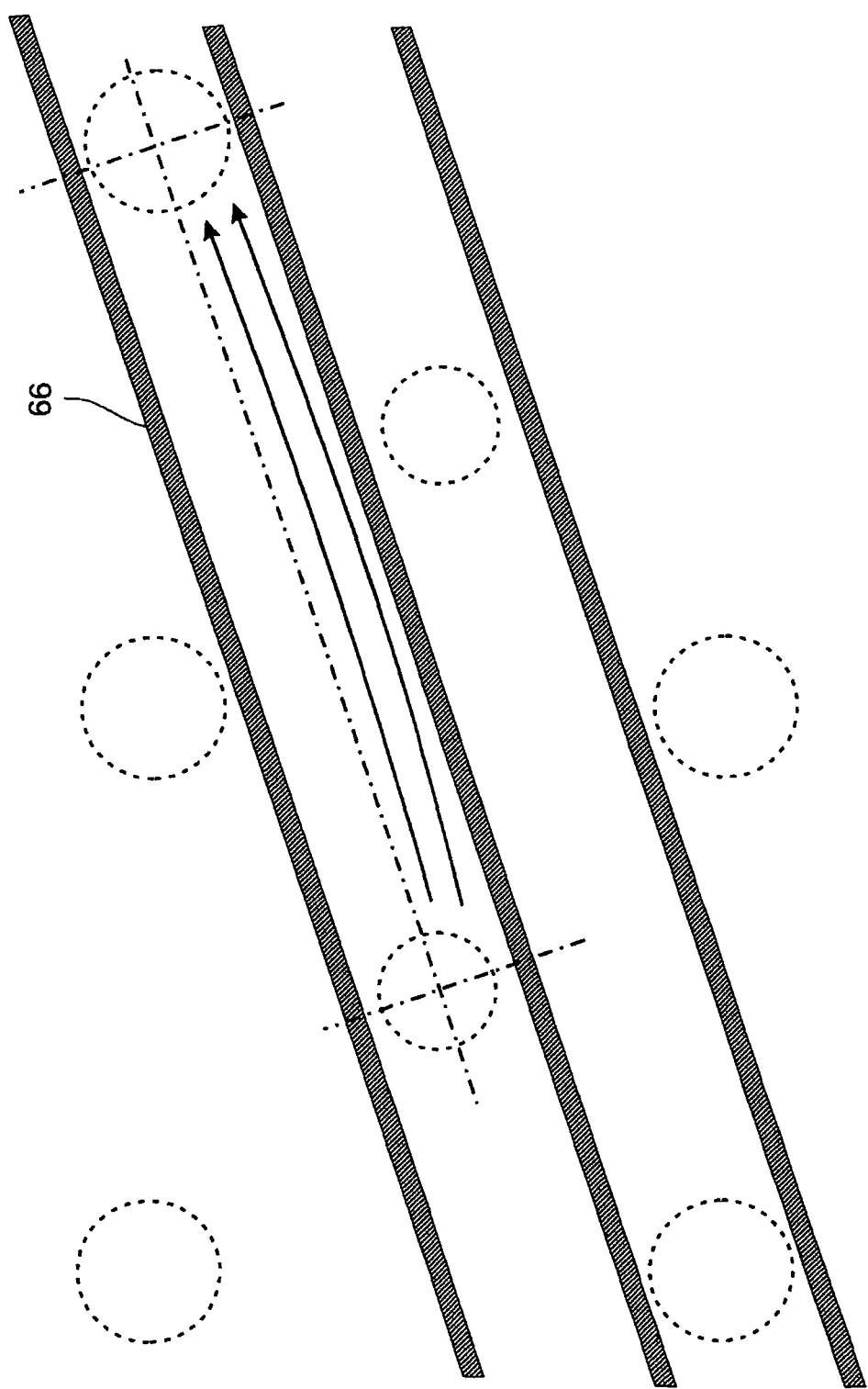
FIG. 20 illustrates a plan view of a further preferred embodiment of surface enhancement features.

FIG. 20 illustrates a plan view of surface enhancement features across several impingement cells having relatively narrow linear fins 66 that create two relatively longer parallel paths from one inlet 32 to two neighboring outlets 36 along an oblique diagonal of the unit cell.

Figure 21:
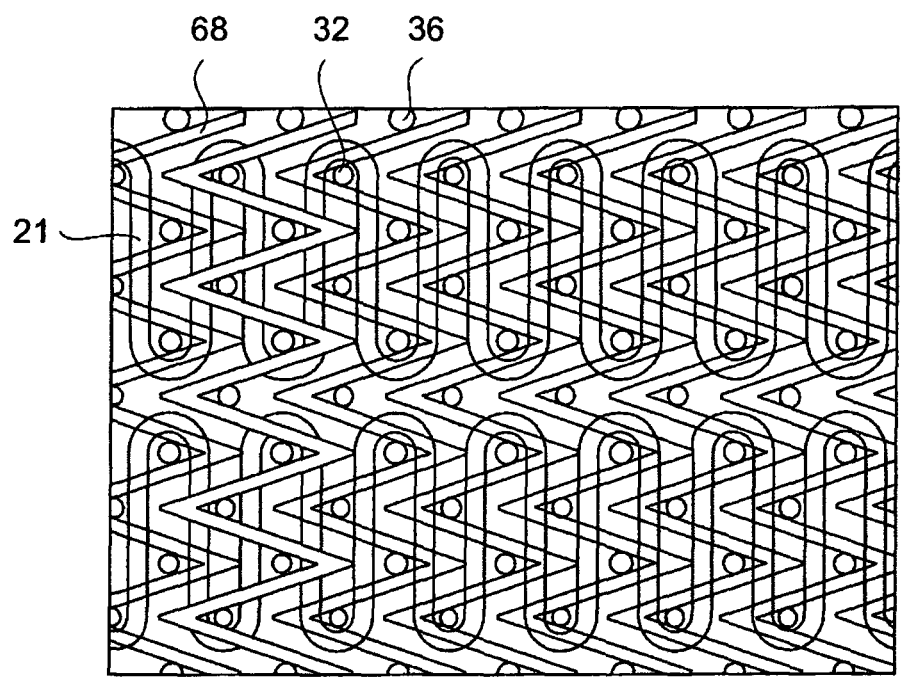
FIG. 21 illustrates a plan view of chevron-form surface enhancement features.

FIG. 21 illustrates a plan view of chevron-form surface enhancement features 68 across multiple impingement cells. Exemplary rows of second level separation walls are superimposed onto the illustration.

Figure 22:
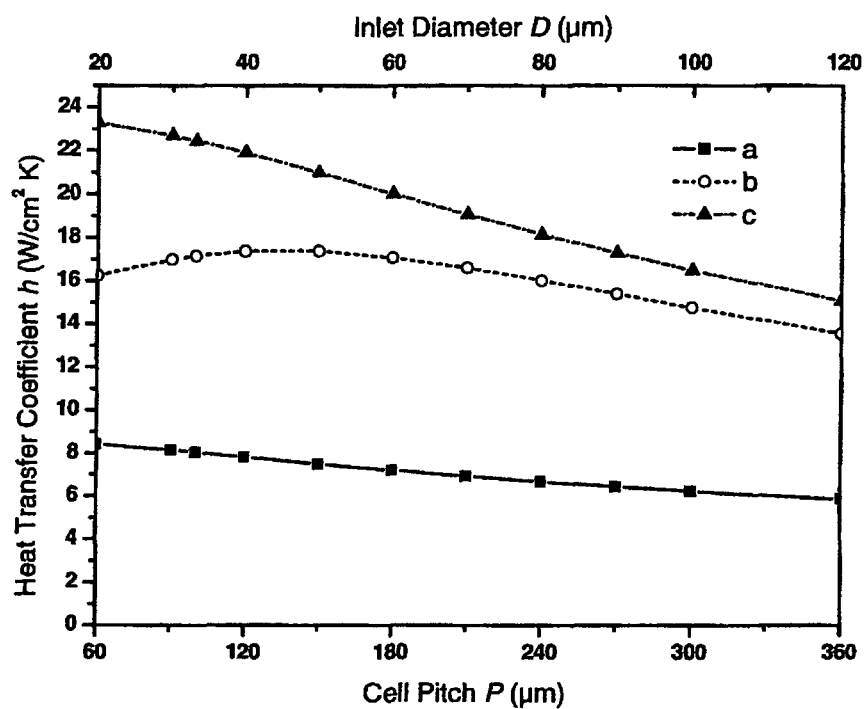
FIG. 22 shows calculated heat transfer coefficients (FIG. 22A) and jet plate pressure drops (FIG. 22B) as a function of the impingement cell inlet pitch, comparing cases a: impingement without surface enhancement, b: impingement with surface enhancement features, c: impingement with surface enhancement features connecting the chip thermally to the jet plate.
Figure 22B:
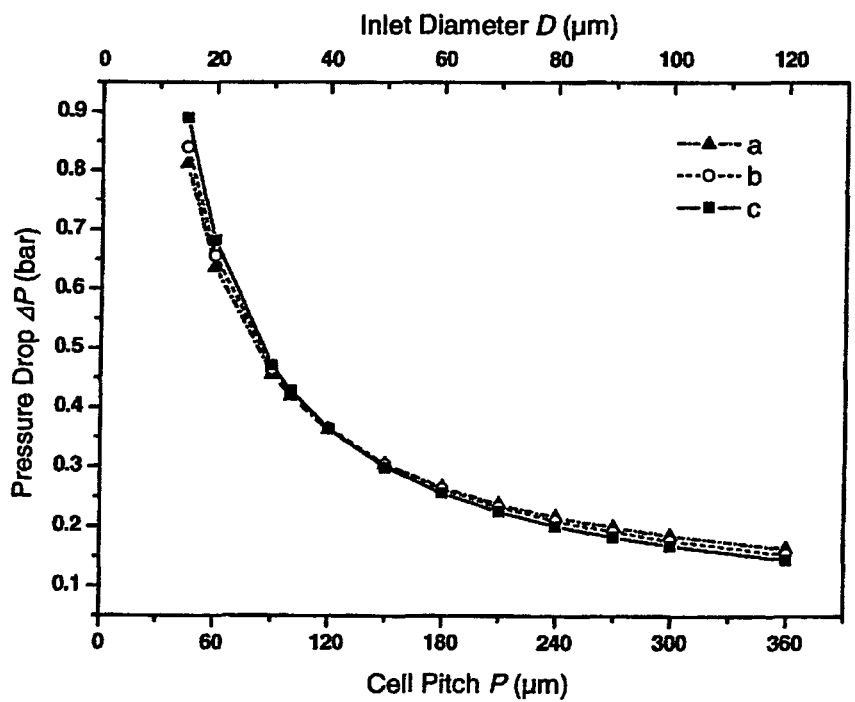

As an example illustrating the dependence of the cooling performance on the impingement cell scale and on the use of surface enhancement schemes, FIG. 22 shows graphs recording the calculated thermal heat transfer coefficient and the calculated pressure drop in the jet plate section of an impingement device as a function of the jet nozzle pitch P, for water as coolant, a constant coolant volume flow of 0.375 l/min for 1 cm2 area of jet plate, a ratio of inlet jet nozzle pitch to inlet jet nozzle diameter of 3, and a ratio of jet nozzle pitch to impingement spacing (the distance between the jet plate and the chip being cooled) of 2. In cases b and c, surface enhancement structures have the layout of FIG. 13. All parts are made of silicon. The data is obtained using a commercial computational fluid dynamics software package. For the simple jet impingement cell without surface enhancement, case a, it is preferable in terms of the rate of heat removal to decrease the cell size i.e. the pitch and inlet nozzle diameter. This decrease does lead to an increase in the jet plate pressure drop which, compounded with additional pressure drops elsewhere in the system, as described in relative terms above, should not in practice exceed a limit imposed by the performance of available external pumps. Also, the fabrication of parts can be expected to reach practical limits below certain dimensions. Thus, in preferred embodiments of the heat exchanger as described so far, inlet jet diameters will typically be in the range of 10 to 200 microns, and inlet jets pitches will typically be 3 to 5 times the jet diameter. The use of surface enhancement features significantly improves the heat transfer coefficient over the simple impingement cell without causing additional pressure drop.

Figure 23A:
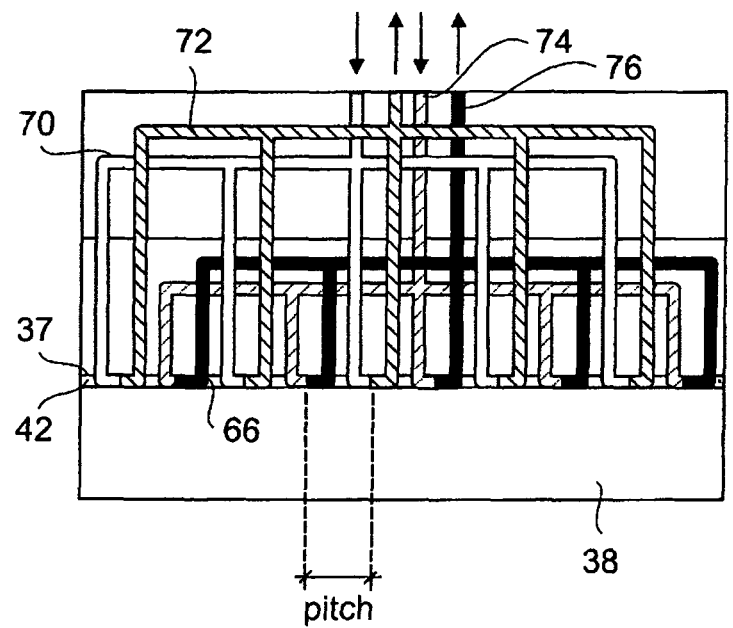
FIG. 23A shows a cross-sectional view and FIG. 23B shows a plan view of the same.

FIG. 23A illustrates an alternative embodiment of a portion of an impingement cooler 70 of the present invention. An inlet channel 70 entering a first level of the cooler branches into several first level input channels which impinge the backside of a chip 38 and each branch of this inlet channel 70 is fed to a branch of an outlet channel 72 via paths through an impingement gap 42 formed with linear fins 66, similar to those illustrated in FIG. 20. The linear fins 66 are surface enhancement features attached between the backside of the chip 38 and the face of the jet plate 37; as illustrated in FIG. 11, upper portion. Thus, this arrangement may be considered as a U-shaped 'microchannel' which impinges the backside of the chip and in such cases differences in inlet and outlet nozzle diameter described above may be smaller or eliminated. Inlet channel 70 and outlet channel 72 together form a first loop. A further inlet channel 74 entering a first level of the cooler branches into several first level input channels which impinge the backside of the chip 38 and feed a branch of further outlet channel 76 via paths formed with linear fins 66. The further inlet channel 74 and further outlet channel 76 together form a second loop.

Figure 23B:
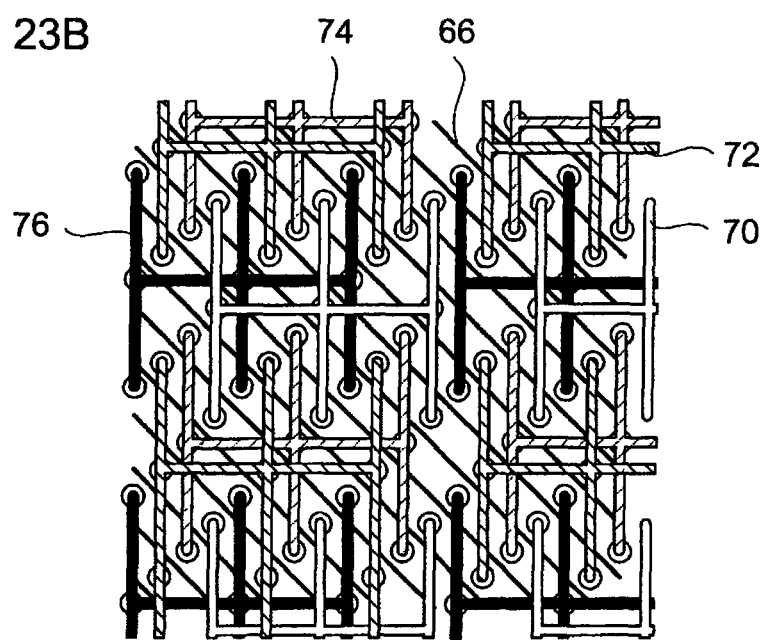

FIG. 23B schematically illustrates a plan view of the first and second loops of FIG. 23A with linear fins 66 illustrated to aid understanding, although these would not necessarily be visible through the jet plate 37.

Advantageously, this embodiment allows relatively short separation of the inlet and outlet channels impinging the backside of the chip. This separation is also known as pitch and may be 100 microns in a preferred embodiment. Such relatively small separation is useful because some chip and cooler systems may require the chip itself to function as a heat spreader. Further advantage is found in that the first loop and second loop are separate, enabling each to operate independently if required. For example, one loop may be designated as a backup, such that the backup loop switches on if the operational loop fails. Or, where normal operation of the chip requires the functioning of both loops, then the failure or maintenance of one loop leaves the other loop functioning alone. To compensate for the loss of cooling capability, the flow rate of coolant through the operational loop may be increased, or alternatively the clock frequency of the chip may be reduced in order to lessen the thermal energy generated by the chip.

Alternatives to various aspects of the above described embodiments of an impingement cooler are envisaged. For example, it is also envisaged that alternative patterns of a hierarchy of input channels and a hierarchy of output channels which are interwoven with each other may be utilized. It is also envisaged that alternative patterns and forms of surface enhancement features may be used, in addition to the diamonds, elongate ovals and posts of the illustrated embodiments. Various suitable materials may be used to fabricate such impingement coolers, and the coolant fluid may be gas or liquid. Where gas is utilized the preferred dimensions of pitch, layer thickness, inlet/outlet/channel hydraulic diameter may be reduced by a factor of 2 compared to the dimensions used in the case of water as stated in the above description. Coolant fluids may also contain additional solid particles, then known as nanofluids, to relatively improve the overall heat transfer due to their thermal capacity or their ability to penetrate the thermal boundary layer.

The structure of the embodiments illustrated may also be used for two phase coolers where liquid evaporates to form gas upon contact with the hot surface. To accommodate the larger volume of the gas, whilst maintaining a low flow speed, the outputs may have to be more than 30% larger than the inputs.

The scope of the use of the surface enhancement features may extend to any scenario where flow control engineering of fluid from one or multiple impinging jets is required.

Inlet and outlet nozzle diameter may vary at in proximity to certain regions of the target surface in order to tune the cooling performance to hotspots.

It will be appreciated that the impingement cooler of the present concept may be interfaced with any of a plurality of high power density devices, for example, high power laser and optics components or power electronics. Also, direct integration of the impingement cooler to various devices may be realized.

Improvements and modifications can be made to the foregoing without departing from the scope of the present invention.

The invention claimed is:

1. An impingement cooling device comprising:
at least a first level structure adjacent an impingement gap, the impingement gap being located between the cooling device and at least one heat source to be cooled, the first level structure comprising:
a layer of substantially parallel inlets and outlets in a distributed array adjacent the impingement gap for supplying and removing fluid for impinging directly on at least one surface of the heat source, wherein outlet diameters are 25-30% larger than inlet diameters,
a channel layer of interdigitated branched channels to supply the inlets with a fluid and drain the outlets of the fluid, said channels being formed by at least one lateral wall separating inlet and outlet paths in the channel layer; and
a second level structure in contact with the first level structure, wherein the second level structure comprises a scaled replica of the first level structure, wherein the second level structure is larger than the first level structure by a predetermined factor selected to optimize fluid flow.

2. The impingement cooling device as claimed in claim 1, further comprising additional hierarchical level structures in contact with previous level structures, wherein each additional level structure comprises a scaled replica of the previous level enlarged by the predetermined factor.

3. The impingement cooling device as claimed in claim 1, wherein the layer of interdigitated input channels and output channels comprises a separation wall forming interlocking digits.

4. The impingement cooling device as claimed in claim 1, wherein the predetermined enlargement factor ranges from 5-15.

5. The impingement cooling device as claimed in claim 1, wherein the inlets and outlets of at least one layer are cylindrical.

6. The impingement cooling device as claimed in claim 1, wherein the inlets and outlets of at least one layer comprise slots.

7. The impingement cooling device as claimed in claim 1, wherein the distributed array has a face centered square pattern of inlets and outlets.

8. The impingement cooling device as claimed in claim 1 additionally comprising surface enhancement features positioned within the impingement gap attached to at least one of the first level and a heated body, wherein the surface enhancement features comprise a plurality of protrusions.

9. The impingement cooling device as claimed in claim 8, wherein said surface enhancement features comprise a plurality of protrusions each having a diamond-shaped form, regularly positioned between inlets and outlets of the first level, whereby the plurality of protrusions directs flow away from stagnation zones.

10. The impingement cooling device as claimed in claim 9, wherein said surface enhancement features further comprise barrier features regularly positioned along diagonals joining the inlets and outlets of the first level.

11. The impingement cooling device as claimed in claim 8, wherein said surface enhancement features comprise a plurality of linear parallel protrusions positioned diagonally such that inlets and outlets of the first level are alternately located in a linear gap between the protrusions.

12. The impingement cooling device as claimed in claim 11, wherein said linear parallel protrusions are attached between the first level and the heated body, and modified to form a plurality of microchannels each joining a single inlet and a single outlet.

13. The impingement cooling device as claimed in claim 12, having a first group of microchannels supplied and drained from a primary channel loop and a second group of microchannels supplied and drained from a secondary channel loop, wherein flow through the first loop is independent of flow through the second loops.

14. The impingement cooling device as claimed in claim 13, wherein the microchannels of the first group and the microchannels of the second group are positioned substantially alternately within the distributed array.

15. The impingement cooling device as claimed in claim 11, wherein said surface enhancement features further comprise barrier features regularly positioned between the inlets and outlets of the first level in the linear gaps.

16. The impingement cooling device as claimed in claim 15, wherein each barrier feature is sub-divided into a plurality of barriers positioned substantially along lines of flow.

17. The impingement cooling device as claimed in claim 8, wherein said surface enhancement features comprise a plurality of chevron-form protrusions positioned such that inlets and outlets of the first level are alternately located in a chevron-form gap between the protrusions.

18. A cooling system comprising:
an impingement cooling device comprising:
at least a first level structure adjacent an impingement gap, the first level structure comprising:
a layer of substantially parallel inlets and outlets in a distributed array adjacent the impingement gap for supplying and removing fluid for impinging directly on the surface of the component to be cooled, wherein outlet diameters are 25-30% larger than inlet diameters, and
a channel layer of interdigitated branched channels to supply the inlets with a fluid and drain the outlets of the fluid, said channels being formed by at least one lateral wall separating inlet and outlet paths in the channel layer,
a second level structure in contact with the first level structure, wherein the second level structure comprises a scaled replica of the first level structure, wherein the second level structure is larger than the first level structure by a predetermined factor selected to optimize fluid flow; and
a microprocessor chip positioned adjacent the impingement cooling device, wherein the impingement gap is between the impingement cooling device and the microprocessor chip allowing fluid to impinge directly on at least one surface of the microprocessor chip.

19. A method for transferring heat away from a heat source, the method comprising the steps of:

provided an impingement cooling device in thermal contact with the heat source, said impingement cooling device comprising at least a first level structure adjacent an impingement gap, the impingement gap being located between the cooling device and the heat source, the first level structure comprising a layer of inlets and outlets in a distributed array adjacent the impingement gap for supplying and removing fluid for impinging directly on at least one surface of the heat source, and a channel layer of interdigitated branched channels to supply the inlets with a fluid and drain the outlets of the fluid, said channels being formed by at least one lateral wall separating inlet and outlet paths in the channel layer; and a second level structure in contact with the first level structure, wherein the second level structure comprises a scaled replica of the first level structure, wherein the second level structure is larger than the first level structure by a predetermined factor selected to optimize fluid flow; and impinging coolant fluid through the impingement cooling device and onto the heat source via the impingement gap, resulting in a minimal coolant fluid pressure drop across the impingement cooling device.

\* \* \* \* \*